United States Patent
Ikegawa et al.

(10) Patent No.: US 6,427,621 B1
(45) Date of Patent: Aug. 6, 2002

(54) PLASMA PROCESSING DEVICE AND PLASMA PROCESSING METHOD

(75) Inventors: Masato Ikegawa, Tsuchiura; Tsutomu Tetsuka, Niihari; Ichiro Sasaki, Yokohama; Tatehito Usui, Niihari; Hironobu Kawahara, Kudamatsu, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/550,169

(22) Filed: Apr. 14, 2000

(30) Foreign Application Priority Data

Apr. 14, 1999 (JP) .......................................... 11-106226

(51) Int. Cl.$^7$ ...................... C23C 16/511; C23C 16/509
(52) U.S. Cl. .......................... 118/723 MW; 118/723 E; 156/345.38; 156/345.41; 156/345.47
(58) Field of Search ................. 118/723 MP, 723 MW, 118/719, 723 E, 728; 156/345; 315/111.21, 111.81, 240; 343/771; 438/798, 707, 709, 710, 711; 216/67; 219/121.43, 121.54

(56) References Cited

U.S. PATENT DOCUMENTS

| | | | | |
|---|---|---|---|---|
| 4,960,071 A | * | 10/1990 | Akahori et al. | 118/722 |
| 5,034,086 A | * | 7/1991 | Sato | 156/345 |
| 5,292,370 A | * | 3/1994 | Tsai et al. | 118/723 MP |
| 5,314,573 A | * | 5/1994 | Higuchi et al. | 438/711 |
| 5,401,356 A | * | 3/1995 | Enami et al. | 438/5 |
| 5,698,036 A | * | 12/1997 | Ishii et al. | 118/723 MW |
| 5,858,162 A | * | 1/1999 | Kubota | 156/345 |
| 6,080,271 A | * | 6/2000 | Fuji | 156/345 |
| 6,136,214 A | * | 10/2000 | Mori et al. | 216/67 |
| 6,158,383 A | * | 12/2000 | Watanabe et al. | 118/723 AN |
| 6,172,321 B1 | * | 1/2001 | Yoshioka et al. | 219/121.41 |
| 6,197,151 B1 | * | 3/2001 | Kaji et al. | 156/345 |
| 6,199,505 B1 | * | 3/2001 | Sato et al. | 118/723 E |
| 6,270,948 B1 | * | 8/2001 | Sato et al. | 430/314 |

FOREIGN PATENT DOCUMENTS

| JP | 11-340200 | * 12/1999 | ......... H01L/21/302 |
|---|---|---|---|
| JP | 2000-150472 | * 5/2000 | ......... H01L/21/302 |

* cited by examiner

*Primary Examiner*—Gregory Mills
*Assistant Examiner*—Rudy Zervigon
(74) *Attorney, Agent, or Firm*—Antonelli, Terry, Stout & Kraus, LLP

(57) ABSTRACT

In the plasma processing device for supplying electromagnetic waves to the first plate, generating plasma in the vacuum atmosphere between the first plate and the second plate which is arranged opposite to it, and processing the board loaded on the second plate, wherein the dielectric window for propagating electromagnetic waves is installed in the outer periphery of the first plate and in the window, the electromagnetic wave distribution corrector composed of an electrical conductor or a dielectric is embedded away from the first plate so that at least the side and bottom of the electromagnetic wave distribution corrector are not exposed in the aforementioned vacuum atmosphere. The electromagnetic wave distribution corrector corrects one-siding of the plasma density distribution at the center.

27 Claims, 20 Drawing Sheets

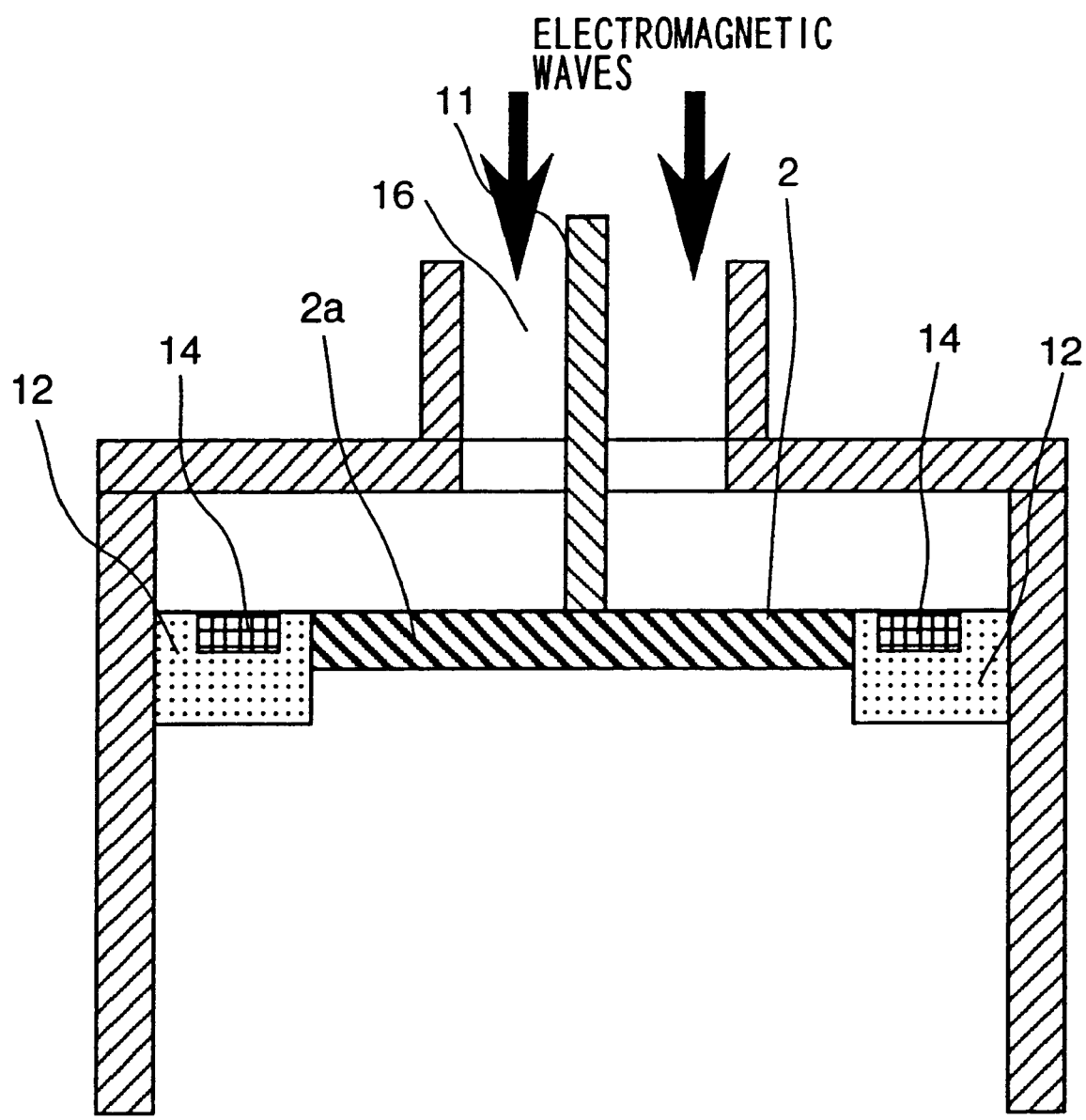

ICF DISTRIBUTION ON BOARD

FIG. 9

| | PERIPHERAL GAP $t_0$=40mm | PERIPHERAL GAP $t_0$=13.5mm |
|---|---|---|
| UHF ELECTRIC FIELD | 1ST PLATE, PERIPHERAL GAP $t_0$, CONDUCTOR RING<br>↑ MAIN ELECTRIC FIELD  ↑ AUXILIARY ELECTRIC FIELD | ↑ MAIN ELECTRIC FIELD  ↑ AUXILIARY ELECTRIC FIELD |
| POWER DEPOSIT | ↑ MAIN POWER DEPOSIT  ↑ AUXILIARY POWER DEPOSIT | ↑ MAIN POWER DEPOSIT  ↑ AUXILIARY POWER DEPOSIT |
| ELECTRON DENSITY | MEDIATE HEIGHT DISTRIBUTION  ↑ LOW DENSITY | UNIFORM DISTRIBUTION  ↑ DENSITY INCREASED |

FIG. 17
| CONDUCTOR RING | a LADLE TYPE | b L TYPE |
|---|---|---|
| UHF ELECTRIC FIELD | 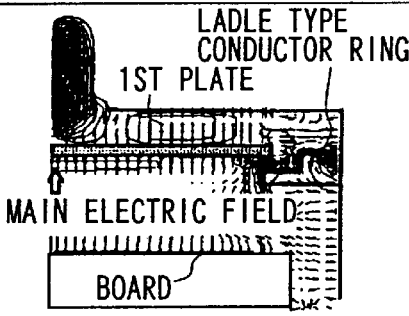 | 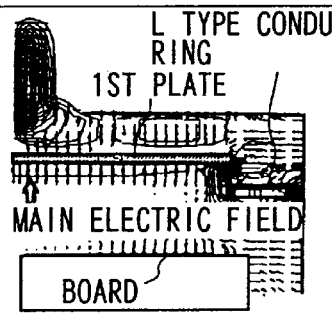 |
| POWER DEPOSIT | 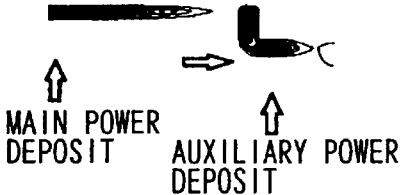 | 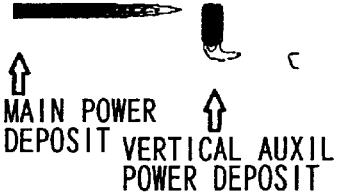 |
| ELECTRON DENSITY | 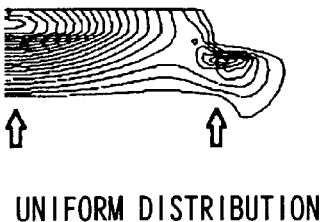  UNIFORM DISTRIBUTION | 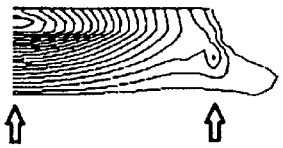  UNIFORM DISTRIBUTION |

PLASMA PROCESSING DEVICE AND
PLASMA PROCESSING METHOD

BACKGROUND OF THE INVENTION

The present invention relates to a plasma processing device capable of effecting distribution control of the processing speed of a board, when processing the board using gas dissociated by a plasma, for producing a semiconductor element board or a liquid crystal board, and a plasma processing method for processing the board surface using the device.

A conventional plasma processing device, for example, introduces electromagnetic waves from a microwave introduction window into a chamber, forms a magnetic field in a separate processing chamber, and generates a plasma. As a processing device using this plasma, there are an etching device and a CVD device available.

In a conventional microwave plasma generation device, for example, in a microwave plasma device as described in Japanese Patent Application Laid-Open 5-263274, by increasing the distance from the microwave introduction window to the board being processed and diffusing the plasma, the plasma distribution on the board, particularly the ion flux distribution, is made uniform. Furthermore, as described in Japanese Patent Application Laid-Open 6-104210, by installing a plurality of dielectrics in the processing chamber and distributing the microwave which has entered from the window between them, it is possible to make the radical distribution generated by the microwave uniform in the processing chamber.

Furthermore, as disclosed in Japanese Patent Application Laid-Open 6-104210, a shielding plate for shielding the plasma reaction chamber from the microwave plasma generation chamber is installed between the chambers, and the chambers are penetrated by a pore. As disclosed in Japanese Patent Application Laid-Open 7-263348, a plurality of dielectric pieces are arranged on the microwave entry surface of the microwave introduction widow for partitioning the plasma generation chamber and the microwave introduction means so as to control the microwave intensity distribution emitted into the plasma generation chamber. Furthermore, as disclosed in Japanese Patent Application Laid-Open 9-148097, the dielectric window for isolating the electromagnetic wave transmission unit from the discharging chamber is installed in the electromagnetic wave transmission unit and an electromagnetic wave reflection plate is installed on the discharging chamber side of the dielectric window so as to generate a ring-shaped plasma in the discharging chamber.

In a recent semiconductor memory, for example, the 256MD RAM (dynamic random access memory) and subsequent devices, to form a fine contact hole, it is proposed to increase the $SiO_2$/SiN selection ratio in the etching of an $SiO_2$ film, for example, to 20 or more. On the other hand, the diameter of the board (wafer) used to manufacture semiconductor memories increases year by year, and, for example, a wafer 300 mm in diameter is used. When a board having such a large diameter is to be plasma-processed, it is most important to ensure the uniformity of plasma distribution in the radial direction.

When a plasma processing device, for example, a device generating plasma by 450-MHz electromagnetic waves, is compared with a plasma processing device using, for example, 2.45 GHz electromagnetic waves, electromagnetic waves are propagated in the plasma under the conditions of a high electron density of 29 times and a high pressure of 5.4 times. On the other hand, in a higher density and at a higher pressure, the attenuation (absorption) of electromagnetic waves in plasma is larger. Therefore, when 450-MHz electromagnetic waves enter a plasma, they immediately attenuate before they reach the ECR surface. Also, in a lower magnetic field area than the ECR surface, an attenuated electric field exists. Like this, electromagnetic waves are absorbed into the plasma in the neighborhood of the sheath right under the antenna, with the result that a crowning electric field is generated and a crowning power deposition and a resultant crowning electron density distribution are obtained.

According to the aforementioned techniques, when the height of the chamber is decreased, if the power is low, plasma centralized as a whole is not diffused sufficiently in the periphery, so that a failure, in that the ion flux to the board decreases toward the periphery, is generated. In a device having a structure in which an electrode for applying a bias voltage to the wall (quartz window) opposite to the board is installed, the microwave is centralized under the electrode depending on the conditions of the magnetic field, and so a failure is generated in that the plasma density being generated is not uniform in the radial direction.

In the microwave plasma processing device, a structure in which a member for absorbing or a member for reflecting the microwave is fixed and installed in the waveguide, and the electromagnetic field intensity distribution of the microwave which enters, irregularly reflects, and then reenters the plasma generation chamber is made uniform in the plasma generation chamber; a structure in which a plurality of dielectric pieces are arranged on the microwave entry surface of the window, and the microwave intensity distribution emitted into the plasma generation chamber is controlled; and a structure in which a electromagnetic wave reflection plate is installed on the discharging chamber side of the microwave leading-in window material have been proposed. However, when these techniques are applied to a structure in which an electrode is provided at the center, it is changed to a structure wherein the electromagnetic wave reflection plate or dielectric pieces are separated from the electrode surface at the center or to a structure wherein they are separated from the plasma, and so there is a problem in that the effect for strengthening the electric field in the neighborhood of the outer periphery of the electrode is small. When the electromagnetic wave reflection plate or the dielectric pieces are in direct contact with the plasma, the electromagnetic waves are centralized in the corners thereof depending on the kind of gas, and strong plasma is generated locally, and so a problem arises in that the electromagnetic wave reflection plate or dielectric pieces are consumed or worn powder is scattered and contaminates the board.

SUMMARY OF THE INVENTION

An object of the present invention is to provide a plasma processing device and a plasma processing method for correcting a non-symmetry of the plasma density distribution relative to the center and for distributing plasma uniformly in the chamber when introducing electromagnetic waves into the chamber and forming plasma and for realizing a uniform processing of the board surface when plasma-processing a board with a large diameter.

To solve the aforementioned problem, the present invention provides a plasma processing device for supplying electromagnetic waves to a first plate, generating plasma in a vacuum atmosphere between the first plate and a second plate which is arranged opposite to it, and processing the board loaded on the second plate, wherein the dielectric window for propagating electromagnetic waves is installed in the outer periphery of the first plate, and, in the window, an electromagnetic wave distribution corrector composed of an electrical conductor or a dielectric is embedded so as to be spaced from the first plate so that at least the side and bottom of the electromagnetic wave distribution corrector are not exposed in the aforementioned vacuum atmosphere.

Another characteristic of the present invention resides in the fact that, in a plasma processing method for supplying electromagnetic waves to the first plate, generating a plasma in the vacuum atmosphere between the first plate and the second plate which is arranged opposite to it, and processing the board loaded on the second plate, the method includes a step of converting the atmosphere in which the board is loaded on the second plate to a vacuum atmosphere, a step of introducing gas into the vacuum atmosphere, a step of introducing electromagnetic waves of 100 to 900 MHz into the vacuum atmosphere via the dielectric window which is installed in the outer periphery of the first plate and in which the electromagnetic wave distribution corrector composed of an electrical conductor or a dielectric is installed so as to be spaced from the first plate and generating a plasma, a step of etching the board loaded on the second plate using the plasma, and a step of taking the board out of the vacuum atmosphere.

According to the present invention, in the window installed in the neighborhood of the outer periphery of the first plate, in order to introduce electromagnetic waves, a substance for changing the scattering of electromagnetic waves, for example, a conductive ring, is inserted, so that the centralization of electromagnetic waves is suppressed and the density distribution of plasma in the radial direction can be controlled. By doing this, when a board with a large diameter is to be plasma-processed, a plasma processing device and a plasma processing method for realizing a uniform processing of the board surface can be provided.

BRIEF DESCRIPTION OF THE DRAWINGS

FIG. 6 is a cross-sectional view of another embodiment of the present invention.

FIG. 9 is a table showing the effect of the peripheral gap of a thin type conductor ring.

FIG. 17 is a table showing the structure of the electromagnetic wave distribution corrector 14 and simulation results.

DESCRIPTION OF THE PREFERRED EMBODIMENTS

Figure 1:
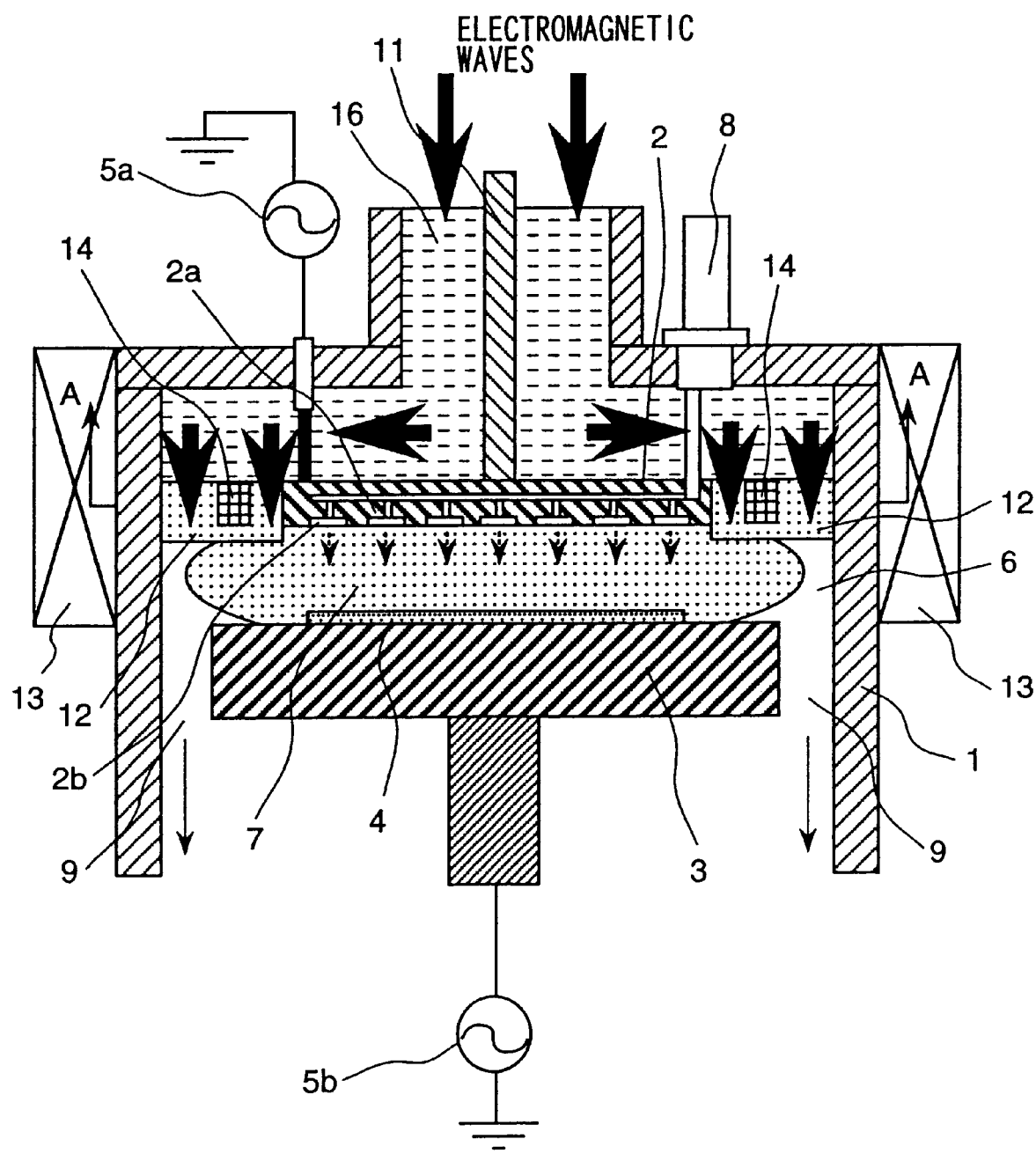
FIG. 1 is a cross sectional view of a plasma processing device representing an embodiment of the present invention.
Figure 2:
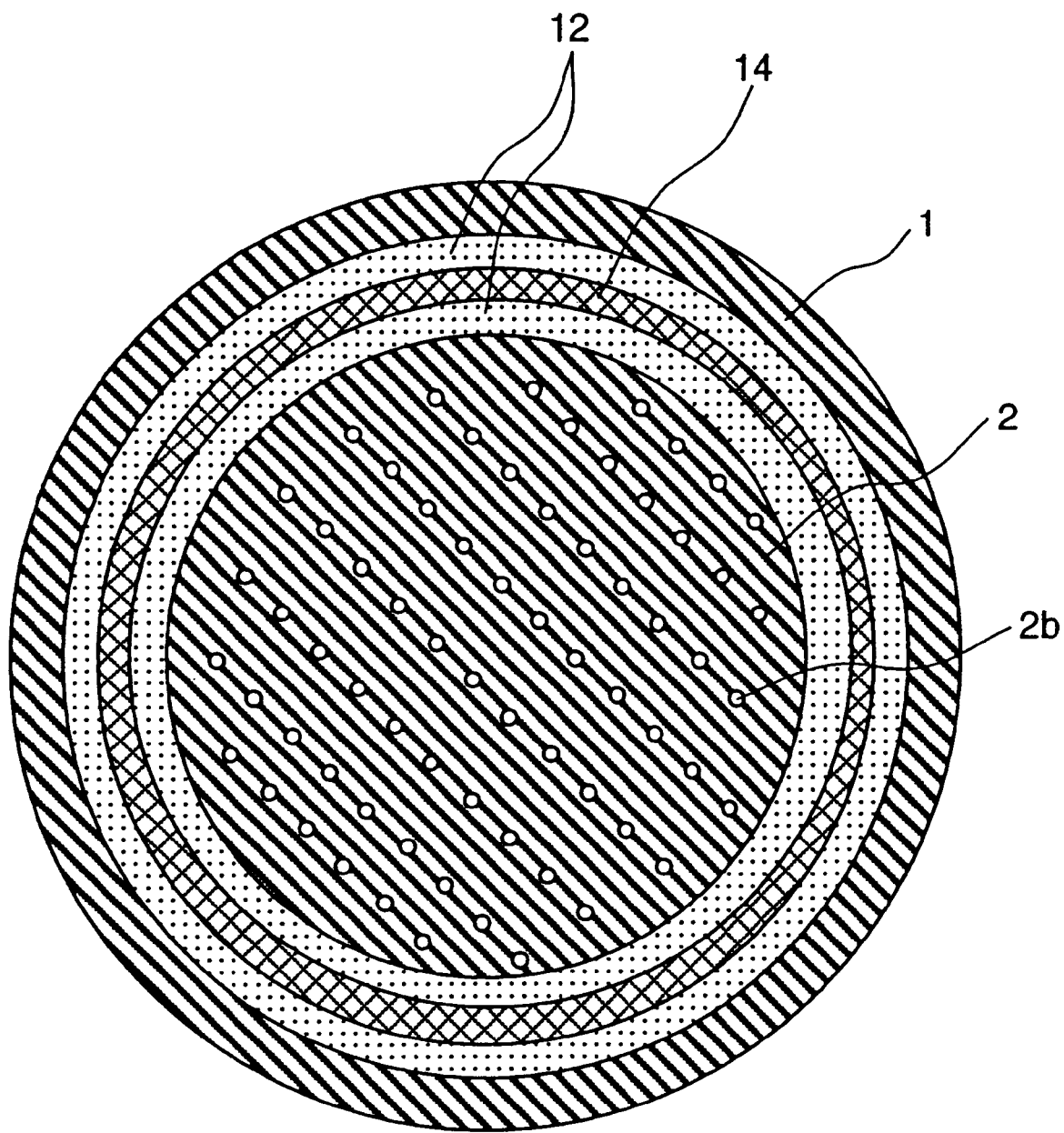
FIG. 2 is a sectional view of the plasma processing device as seen along line A—A' in FIG. 1.
Figure 3:
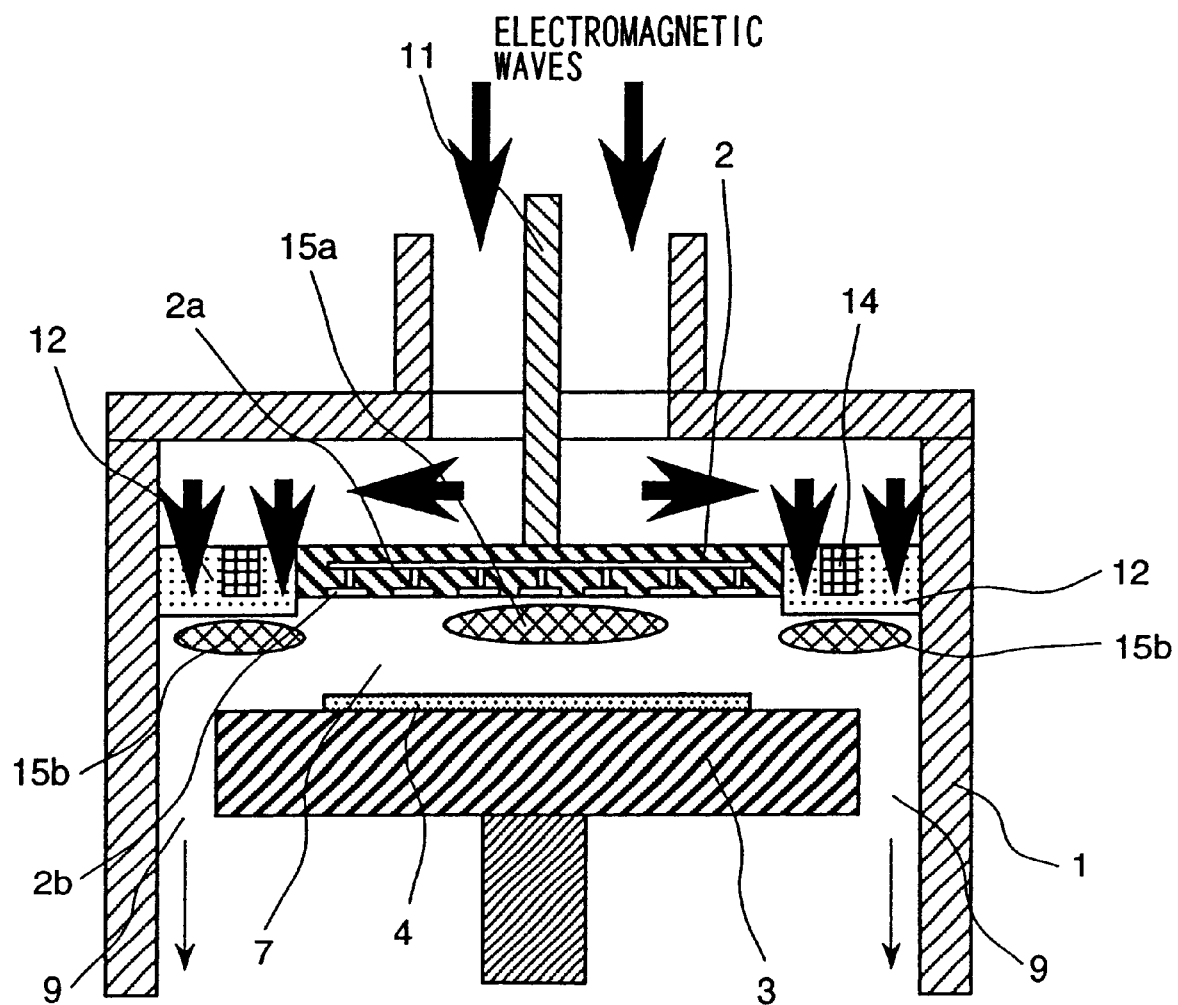
FIG. 3 is a conceptual diagram for explaining the operation of the plasma processing device shown in FIG. 1.
Figure 4:
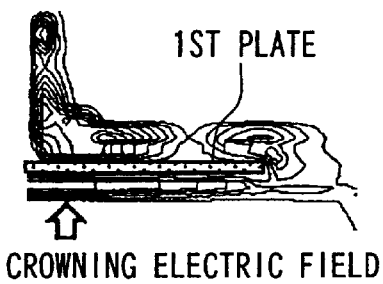
FIG. 4 is a table showing contours of the UHF electric field intensity Eab, power deposition, and electron density distribution which are obtained by the simulation of a conventional plasma processing device and a plasma processing device having a conductor ring according to the present invention.

A first embodiment of the present invention will be explained with reference to FIGS. 1 to 4. FIG. 1 is a cross sectional view of a plasma processing device employing the method of the present invention. FIG. 2 is a detailed cross sectional view of the embodiment. FIGS. 3 and 4 are conceptual diagrams showing the effects of the embodiment. The etching process will be explained hereunder as an example.

In FIGS. 1 and 2, inside a chamber 1, a board 4 is mounted on a second plate 3 which is arranged opposite to a first plate 2. On the first plate 2, a coaxial cable 11 for supplying electromagnetic waves of 100 to 900 MHz, for example, 450 MHz, is installed, and the plate 2 is connected to a 450-MHz power source (not shown). 450-MHz electromagnetic waves propagate, as shown by the thick arrows, between the chamber 1 and the coaxial cable 11, pass through a quartz block 12, and are introduced into a processing chamber 6. The space between the chamber 1 and the coaxial cable 11 may be filled with a dielectric 16 so as to easily propagate electromagnetic waves. The frequency of electromagnetic waves may be in the UHF band, VHF band, microwave band, or RF band.

Outside the chamber 1, an electromagnetic coil 13 is installed so as to generate a magnetic field. When the frequency of electromagnetic waves is 450 MHz in the range of 300 to 600 MHz, electron cyclotron resonance (ECR) is generated at a magnetic field intensity of 0.0161 tesla (161 gausses). In this way, plasma 7 is generated in the processing chamber 6 between the first plate 2 and the second plate 3 and the board 4 is processed. To the first plate 2 and second plate 3, RF (high frequency) auxiliary power sources 5$a$ and 5$b$ are connected so that a bias voltage is applied. The electromagnetic coil 13 is disposed outside the chamber 1 to generate the magnetic field. In a case where the frequency of the electromagnetic waves is within a range of 300 to 600 MHz, an electron cyclotron resonance (ECR) takes place at an intensity of magnetic field of 0.0161 tesla (161 Gausses). As described above, a plasma 7 is formed between the first plate 2 and the second plate 3 in the process chamber 6. RF (high frequency) auxiliary power supplies 5a, 5b are connected to the first plate 2 and the second plate 3 to be supplied with bias voltages, respectively. A high frequency power having a frequency of 100 kHz to 14 MHz is applied to the first plate 2, the second plate 3 and the substrate 4 at 0.5 W/cm$^2$ to 8 W/cm$^2$ per unit area from the auxiliary power supplies 5a, 5b. The center of the first plate 2 has many gas holes 2a, which are connected to a gas supply means 8 and a so-called shower head is formed. The arrow of a dashed line indicates the flow of gas. An exhaust hole 9 is provided in the outer periphery of the second plate 3 and air is exhausted by a vacuum pump (not shown in the drawing). Carbon or silicone is used as a material of the first plate 2.

As plasma generation gas for etching, a mixed gas of fluorocarbon series gases, such as argon and $CF_4$ or $C_4F_8$, and gases such as $Cl_2$, $BCl_3$, $SF_6$, and HBr are used appropriately depending on the film to be etched.

This embodiment is characterized in that, in the ring-shaped concavity provided in the quartz block 12, an electromagnetic wave distribution corrector 14 composed of a conductor ring having a rectangular section, is arranged and fixed. FIG. 2 is a view taken along the line A—A in FIG. 1. The quartz block 12 may be formed integratedly so as to cover the electromagnetic wave distribution corrector 14. However, the integrated forming of these units is generally difficult, so that a construction wherein the quartz block 12 is divided into a plurality of parts, the electromagnetic wave distribution corrector 14 is inserted in a cavity therebetween, and then they are integrated as desirable. A plurality of conductor rings may be concentrically arranged in the window.

In this case, the electromagnetic wave distribution corrector (conductor ring) 14 is in a ring-shape composed of a conductor, such as aluminum, copper, or iron, and the conductor ring 14 is in a floating state in that it is not electrically connected to the first plate 2 and the chamber 1.

The quartz block 12 may not cover the conductor ring 14 perfectly, however, it is sufficient that the surface in contact with the plasma is covered with the quartz plate so that the conductor ring 14 is not directly exposed to the plasma. Namely, to prevent at least the side and bottom of the conductor ring 14 from being exposed to the plasma atmosphere, the thickness of the quartz inserted between the chamber surface and the conductor ring 14 is set to, for example, 6 mm or so. The diameter of the first plate 2 is designed to have various values depending on the condition to be used; and, for example, it is set to a value smaller than 1.2 times the board diameter. The conductor ring 14 is installed in the neighborhood of the outer diameter of the first plate 2 at a certain interval with the first plate 2. The interval is 6 mm or more, preferably, for example, 10 mm or so. When the interval is excessively large, the effect of electromagnetic wave distribution correction, that is, the uniformity of the density distribution of plasma in the radial direction, lowers. In many cases, the conductor ring 14 is installed beside the first plate 2. Namely, the conductor ring 14 and the first plate 2 are set so that the heights of the surfaces thereof opposite to the plasma in the axial direction are almost the same.

According to this embodiment, as shown in FIG. 3, electromagnetic waves propagate toward the center of the chamber 6 along the first plate 2 and also propagate along the inner side and outer side of the conductor ring 14, which operates as an electromagnetic wave distribution corrector.

A simulation was performed for a conventional plasma processing device and the plasma processing device having the conductor ring of the present invention. The contour diagrams of the UHF electric field intensity Eab, power deposition, and electron density distribution obtained by this simulation are shown in FIG. 4. In the conventional type device, a crowning electric field was generated and a crowning power deposition and a resultant crowning electron density distribution were obtained.

On the other hand, when the conductor ring was adopted, the auxiliary electric field was held right under the conductor in the outer periphery, an auxiliary power deposition was added there, and a W type electron density distribution was obtained, so that the effect of uniformalization is produced in the radial direction. The result shows that the conductor ring produces a high effect for raising the outer periphery of the crowning plasma distribution.

As mentioned above, by adopting the use of a conductor ring, together with the electric field under the first plate 2, the intense electric field is held even under the conductor ring 14. Therefore, as shown in FIG. 3, along with the power deposition 15a at the center of the first plate 2, the auxiliary power deposition 15b is provided even under the conductor ring 14, and plasma is generated more uniformly, in that the outer periphery of the plasma distribution, which is maximized in the neighborhood of the center, is increased, so that the plasma distribution is made uniform. The material of the ring may be a dielectric medium having a dielectric constant different from that of the quartz block 12. By use of such a constitution, when the dielectric constant of the conductor ring 14 is selected, an effect can be obtained in which the intensity of the electric field, which can be held under the conductor ring 14, can be adjusted.

Therefore, according to the present invention, a board having a large diameter, such as 200 mm to 350 mm, can be plasma-processed uniformly over the surface thereof.

The material of the conductor ring is not limited to a solid, but may also be a liquid. As a liquid, for example, water or a cooling medium which serves to effect temperature adjustment of the window may be used. By use of such a constitution, a device in which the plasma distribution is uniform and the change with time is small can be provided. With respect to the conductor, a shape in the form of a hollow outer shell may be used. By use of such a constitution, a plasma processing device which is light in weight and has a uniform plasma distribution can be provided.

The conductor ring 14 and the first plate 2 or the chamber 1 may be connected to each other with an electric wire via a switch (not shown in the drawing). When the switch is turned on in such a constitution, the conductor ring 14 and the first plate 2 or the chamber 1 are electrically connected to each other and are set at the same potential. When the intensity of the electric field formed under the conductor ring 14 is controlled by such an operation, the plasma distribution in the chamber can be controlled optionally. A plurality of such conductor rings 14 may be installed in the radial direction. By changing the width and interval of these conductor rings 14, the intensity distribution of the electric field held under the conductor rings 14 can be changed.

Figure 5:
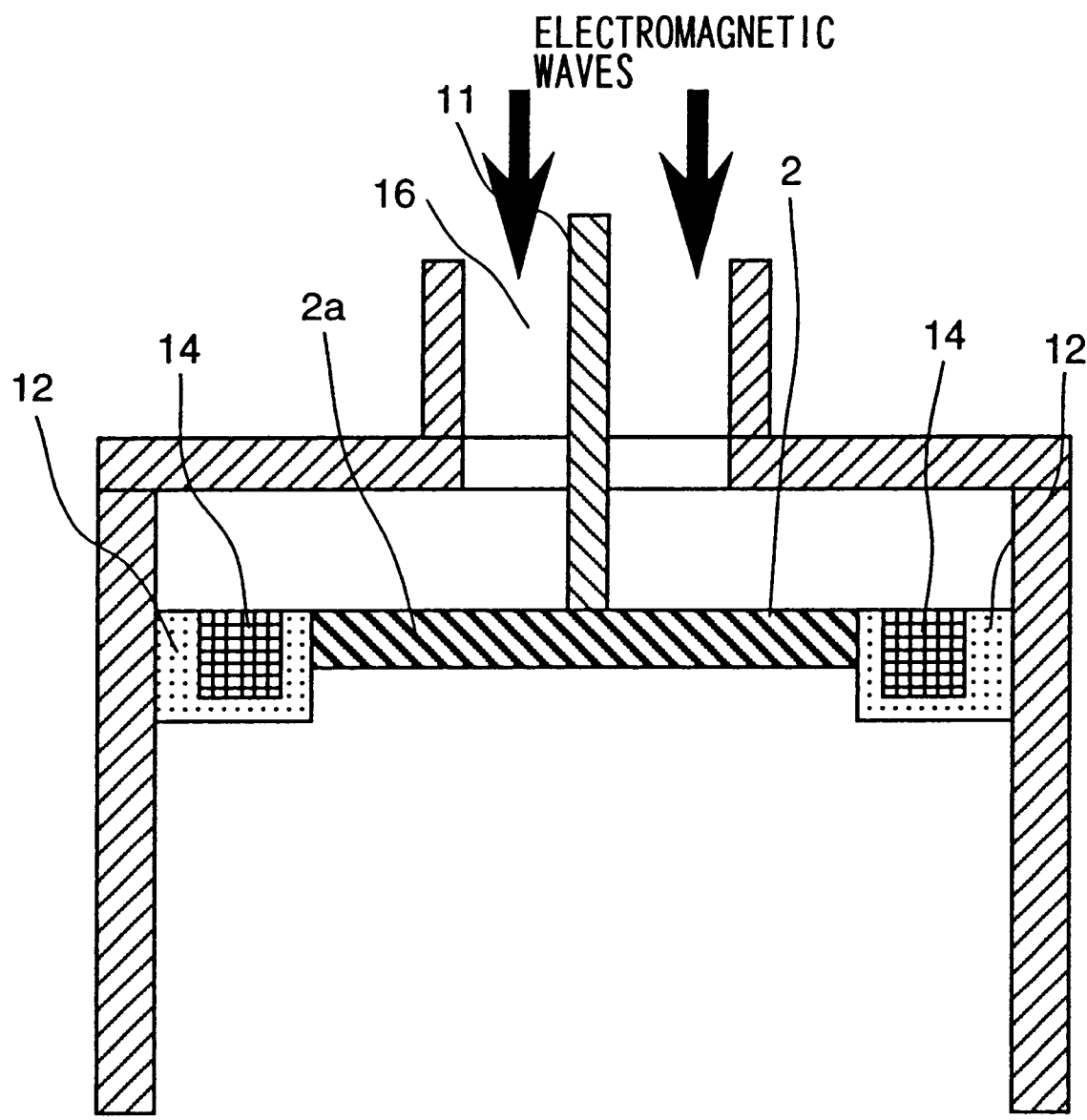
FIG. 5 is a cross-sectional view of another embodiment of the present invention.

FIG. 5 is a cross-sectional view of another embodiment of the present invention, in which the thickness of the electromagnetic wave distribution corrector, that is, the conductor ring 14, is greater than the thickness of the first plate 2, and the bottom of the conductor ring 14, whose top is arranged at the same height as that of the top of the first plate, projects below the bottom of the first plate.

FIG. 6 is a cross-sectional view of another embodiment of the present invention, in which the thickness of the electromagnetic wave distribution corrector, that is, the conductor ring 14, is less than the thickness of the first plate 2; accordingly, the bottom of the conductor ring is recessed from the bottom of the first plate. When the bottom of the conductor ring 14 extends downward beyond the bottom of the first plate 2, as shown in the example in FIG. 5, the electric field of electromagnetic waves is easily held under the conductor ring 14 and the plasma density under the conductor ring 14 increases. Conversely, when the bottom of the conductor ring 14 is recessed relative to the bottom of the first plate 2, as shown in the example in FIG. 6, the electric field under the conductor ring 14 is weakened and the plasma density under the conductor ring 14 is lower.

Figure 7A:
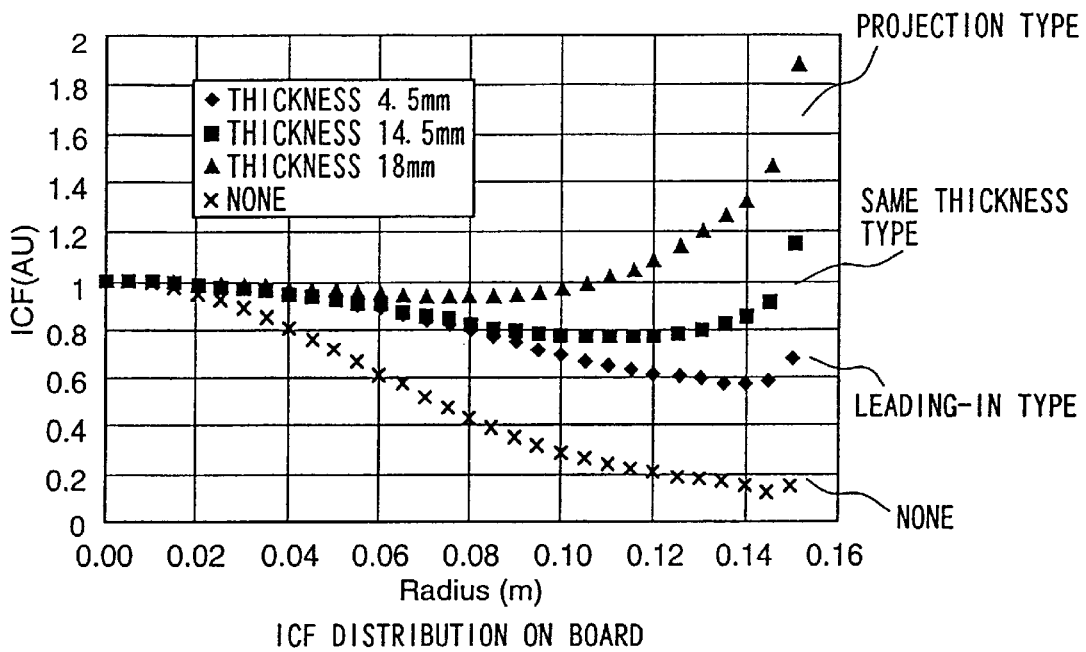
FIG. 7($a$) is a graph and FIG. 7($b$) is a table showing results of the ICF distribution examined by simulation by changing the antenna diameter, conductor ring material (dielectric constant), and conductor ring thickness so as to check the characteristics of the conductor ring in the device of the embodiments shown in FIGS. 5 and 6.
Figure 7B:
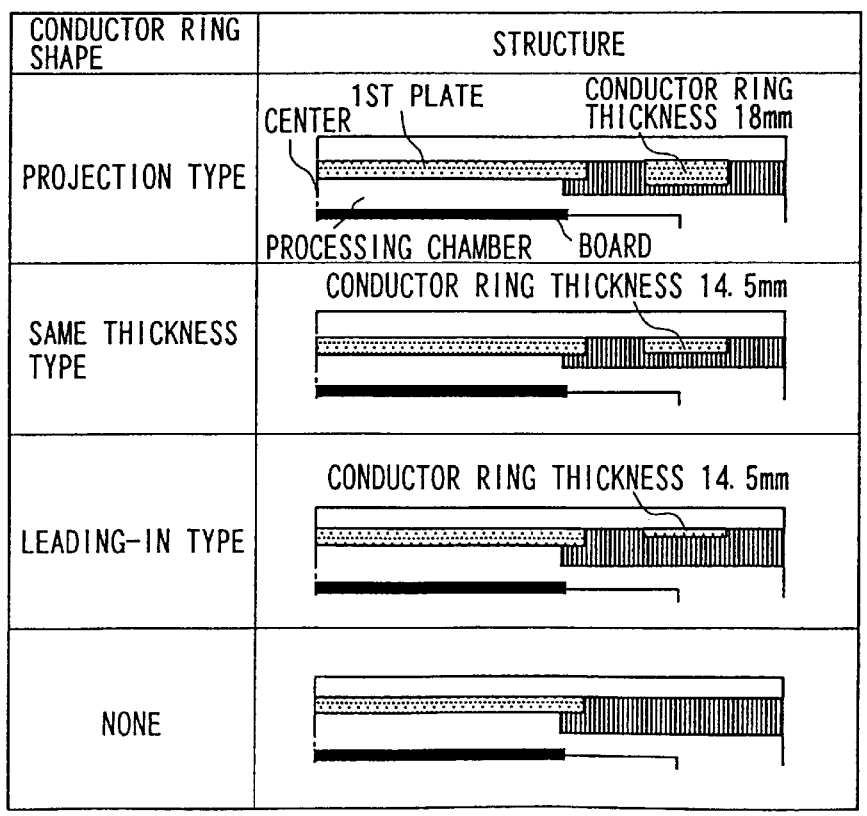

To check the characteristics of the conductor ring when the position thereof is changed as in the embodiments illustrated in FIGS. 5 and 6, the antenna diameter, conductor ring material (dielectric constant), and conductor ring thickness were changed and the distribution of ion current density (ICF) entering the board was checked by simulation. The specific inductive capacity of the quartz is 3.5. The results of this simulation are shown in FIGS. 7(*a*) and 7(*b*). The simulation shows that a thick ring projected down produces a great effect of increasing the outer periphery of the ICF.

Figure 8:
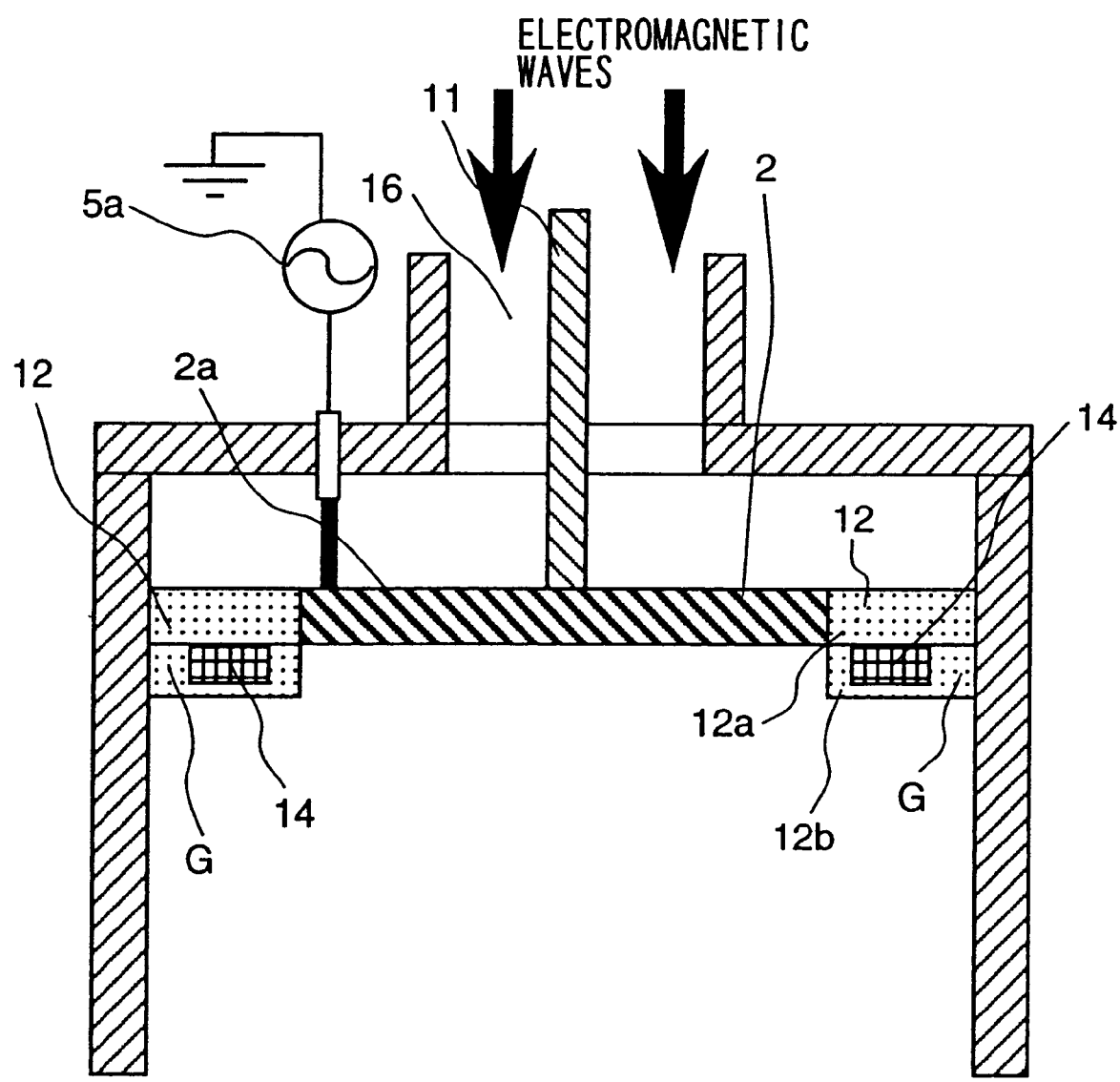
FIG. 8 is a cross-sectional view of another embodiment of the present invention.

FIG. 8 is a cross-sectional view showing another embodiment of the present invention, in which the conductor ring 14 operating as an electromagnetic wave distribution corrector is positioned at the lower part of the quartz block 12. Namely, the top of the conductor ring 14 is in a position equivalent to the bottom of the first plate 2*a*. When the conductor ring 14 is configured as described above, it can be miniaturized and can hold the electric field efficiently. In the manufacture of the device, the quartz block 12 is divided into two small blocks 12*a* and 12*b*, the conductor ring 14 is inserted into a cavity of the block 12*b*, and then the blocks 12*a* and 12*b* are joined integratedly. Even in the following embodiments, the conductor ring 14 is divided into a plurality of small blocks according to the use, and they are formed integratedly as a whole in a state in which the conductor ring 14 is incorporated inside.

FIG. 9 is a table showing the effect of the peripheral gap of a thin type conductor ring. The peripheral gap is referred to as a gap G disposed between the outer periphery of the conductor ring 14 and the outer periphery of the quartz block 12 in the radial direction in FIG. 8. When the peripheral gap is made smaller, for example, to about 13.5 mm or less, it has been found that the intensity of the electric field right under the conductor ring, the power deposition, and the auxiliary plasma density are changed. If the intense magnetic field conditions are to be used regularly, it is desirable to increase the peripheral gap of the conductor ring.

Figure 10:
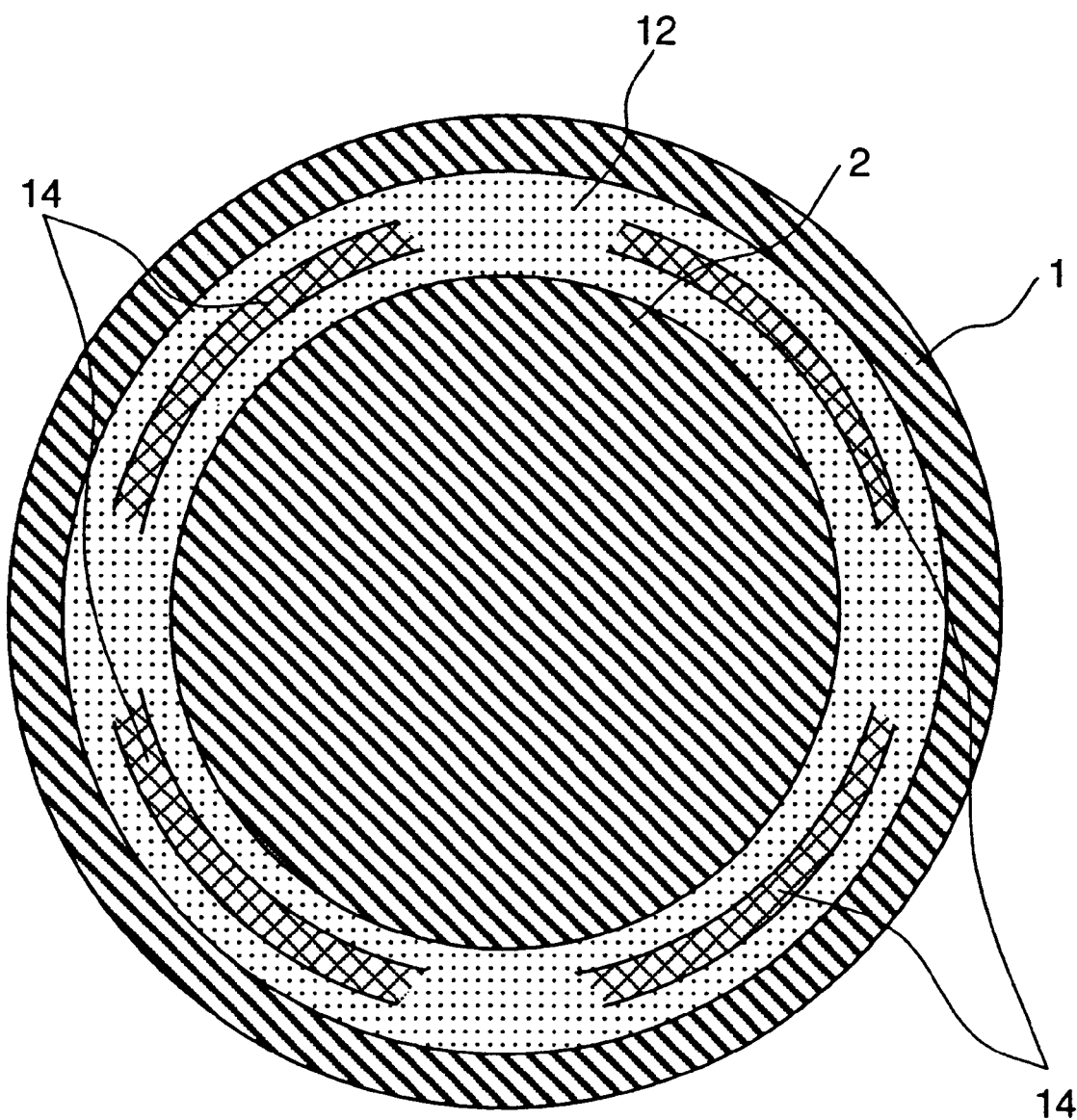
FIG. 10 is a cross-sectional view of another embodiment of the present invention.

FIG. 10 is a cross sectional view of another embodiment of the present invention, in which the electromagnetic wave distribution corrector 14 is not a continuous ring, but is composed of a plurality of conductor pieces which are divided at an equal interval in the peripheral direction. When the electromagnetic wave distribution corrector 14 is composed of a plurality of conductor pieces like this, the size of each single electromagnetic wave distribution corrector can be made smaller, whereby the processing cost can be reduced.

Figure 11:
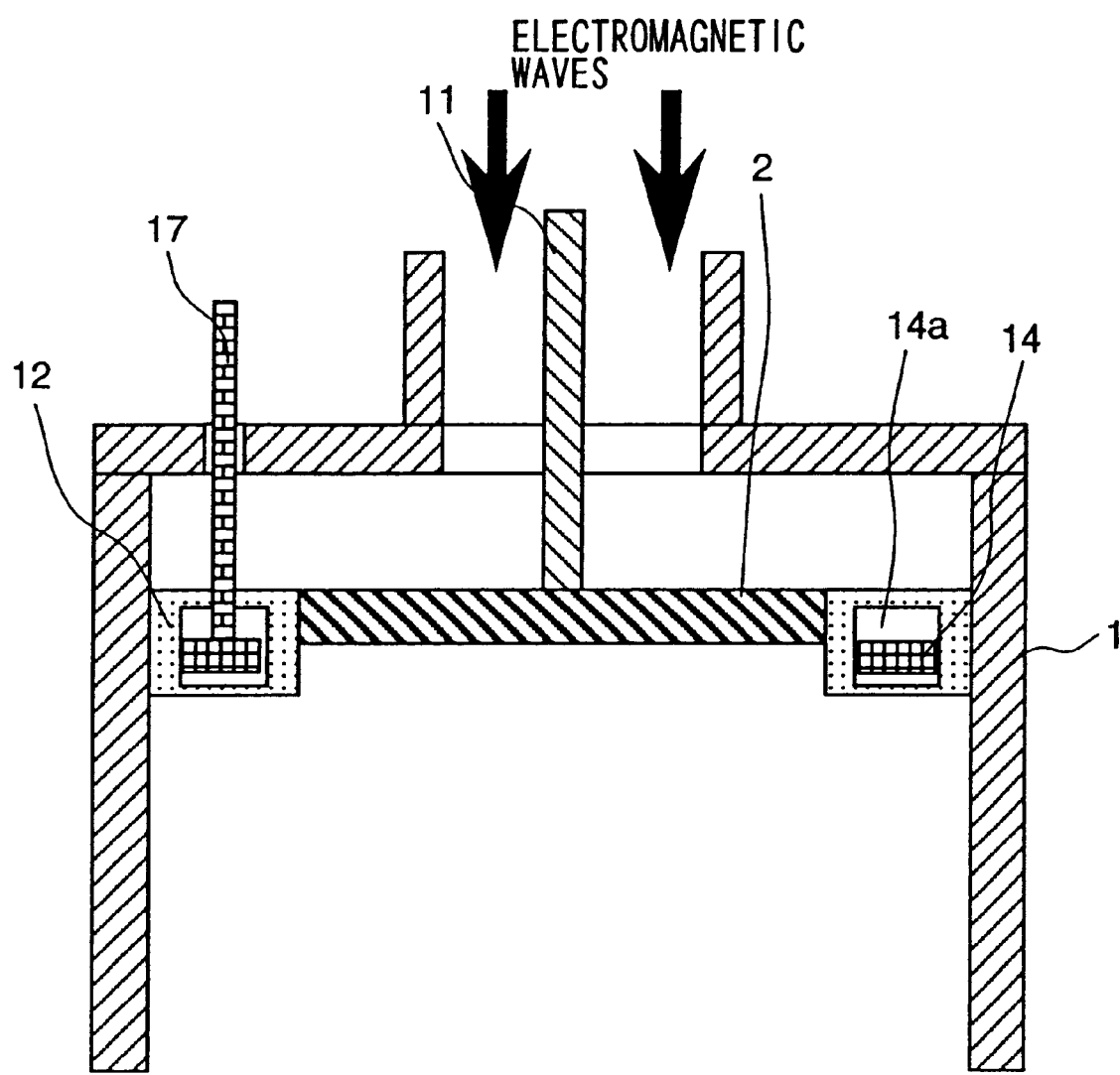
FIG. 11 is a cross-sectional view of another embodiment of the present invention.

FIG. 11 is a cross sectional view of another embodiment of the present invention, in which a moving mechanism 17, which can move up and down, is connected to the electromagnetic wave distribution corrector 14 composed of a conductor ring installed in a cavity 14*a* of the quartz block 12. By use of such a constitution, the intensity of the electric field held at the lower part of the electromagnetic wave distribution corrector 14 can be changed, whereby the plasma distribution in the radial direction can be controlled.

Figure 12:
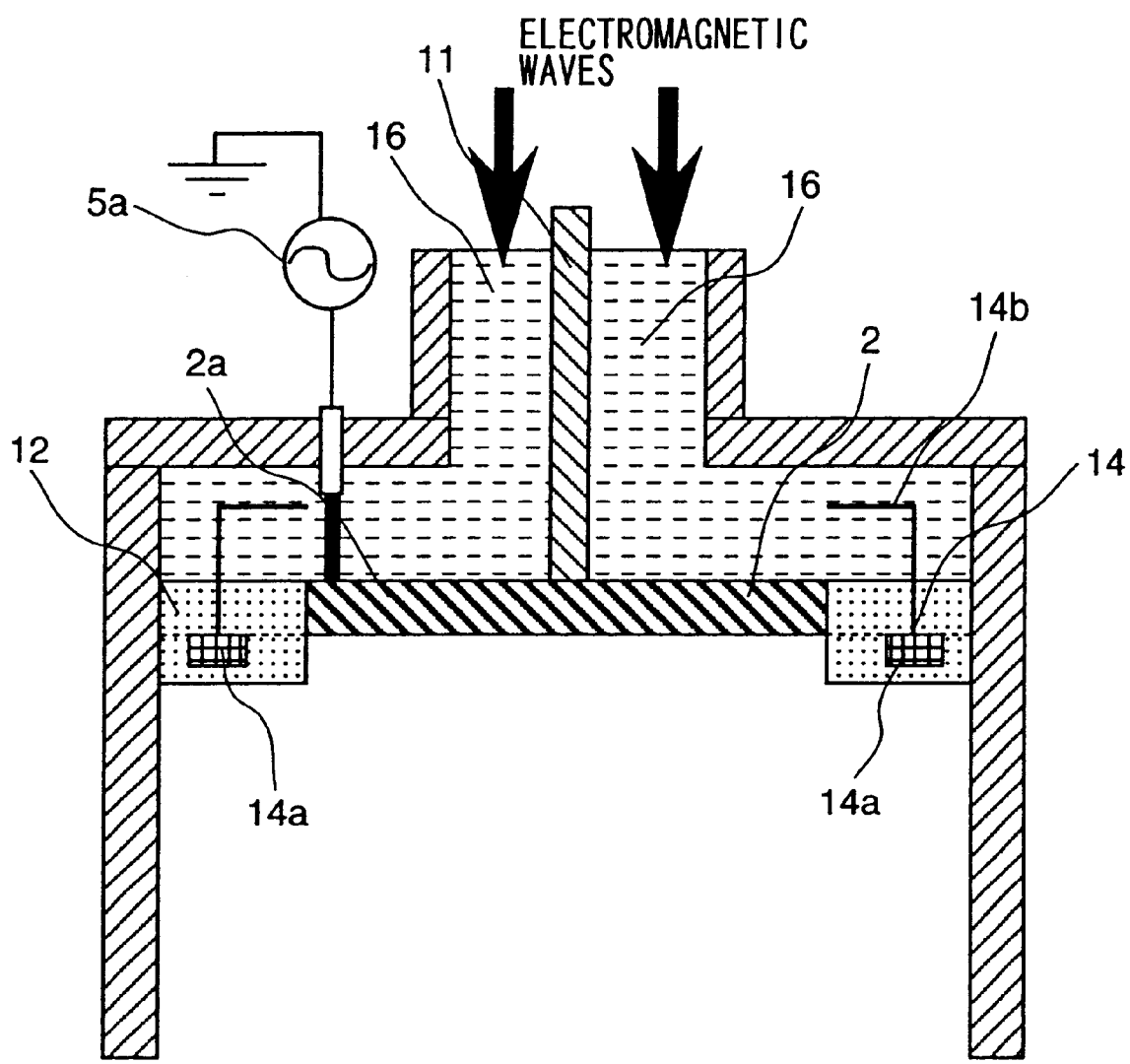
FIG. 12 is a cross-sectional view of another embodiment of the present invention.

FIG. 12 is a cross sectional view of another embodiment of the present invention, in which a dielectric 16 is inserted in the space between the chamber 1 and the coaxial cable 11 and the first plate 2, and the electromagnetic wave distribution corrector 14 is composed of a corrector body 14*a* and an auxiliary plate 14*b*, which auxiliary plate 14*b* is disposed so as to project into the dielectric 16. The auxiliary plate 14*b* is composed of a conductor. The auxiliary plate 14*b* may be connected to the corrector body 14*a* or it may be disposed at a minute distance from it.

By addition of the auxiliary plate 14*b*, which is composed of such a light member, the plasma distribution in the radial direction can be controlled. Namely, electromagnetic waves are distributed on the front and back of the auxiliary plate 14*b* and led to the corrector body 14*a*, so that the intensity ratio of the electric field formed under the first plate and the electric field held at the lower part of the electromagnetic wave distribution corrector 14 can be changed, whereby the plasma distribution in the radial direction can be controlled.

The corrector body 14*a* and the auxiliary plate 14*b* of the electromagnetic wave distribution corrector 14 may be composed of a thin conductor film. The corrector body 14*a* and the auxiliary plate 14*b* may be formed by depositing a conductor film, made of a material such as aluminum, on a dielectric plate, made of a material such as alumina. By use of such a constitution, a device which is light in weight and can be manufactured at a low cost can be obtained.

Figure 13:
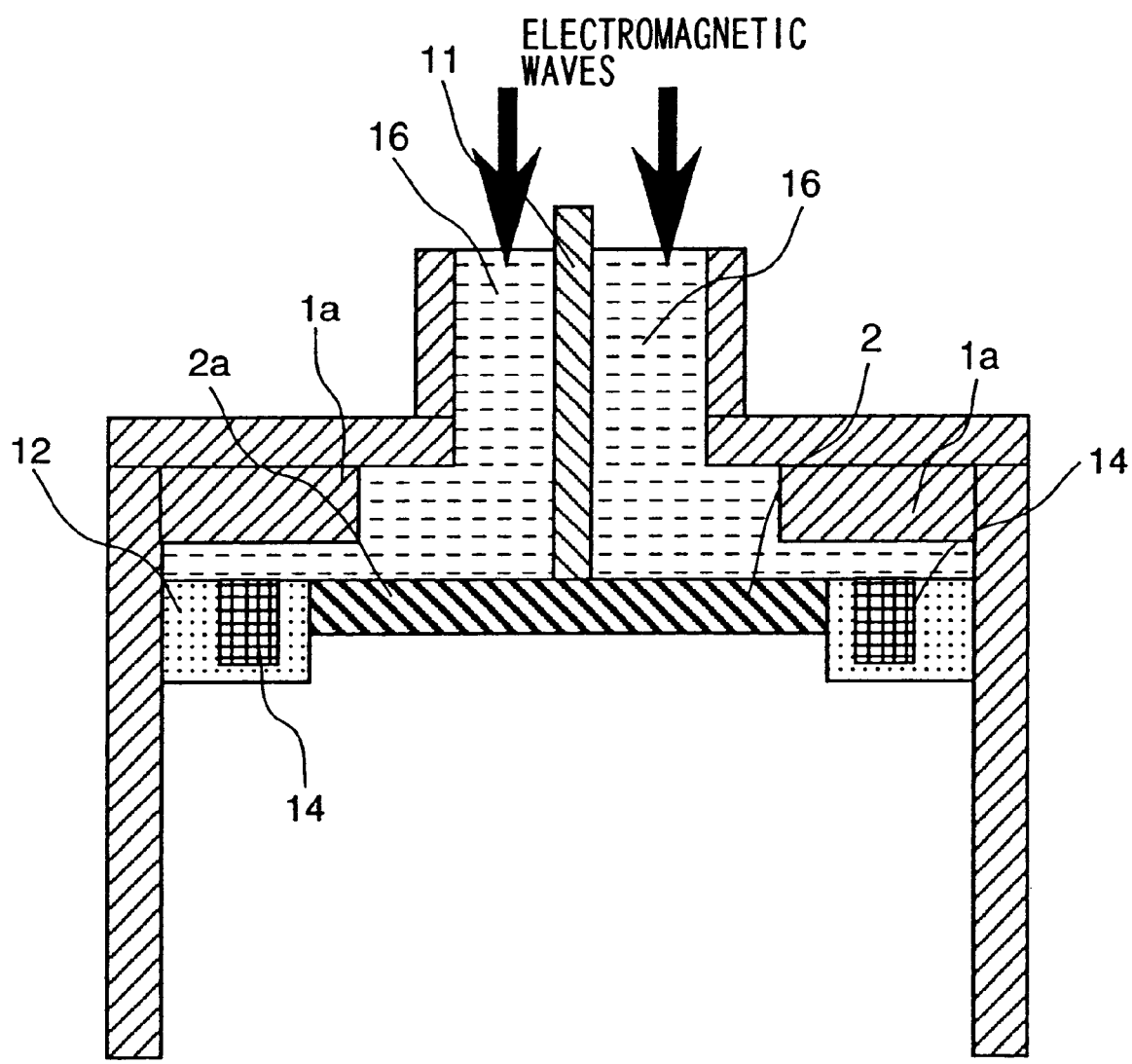
FIG. 13 is a cross-sectional view of another embodiment of the present invention.

FIG. 13 is a cross sectional view of another embodiment of the present invention, in which, in the space occupied by a portion of the dielectric 16 on the first plate 2 between the chamber 1, the first plate 2, and the quartz block 12, the axial gap is changed in the radial direction by a gap change plate 1*a*. Particularly, the axial gap on the side of the electromagnetic wave distribution corrector 14 is narrower than on the other side. By use of such a constitution, the electric field of electromagnetic waves formed between the electromagnetic wave distribution corrector 14 and the gap change plate 1*a* is strengthened, so that the intensity ratio of the electric field held at the lower part of the electromagnetic wave distribution corrector 14 relative to the electric field held under the first plate can be increased, whereby the plasma density generated under the electromagnetic wave distribution corrector 14 is increased.

Figure 14:
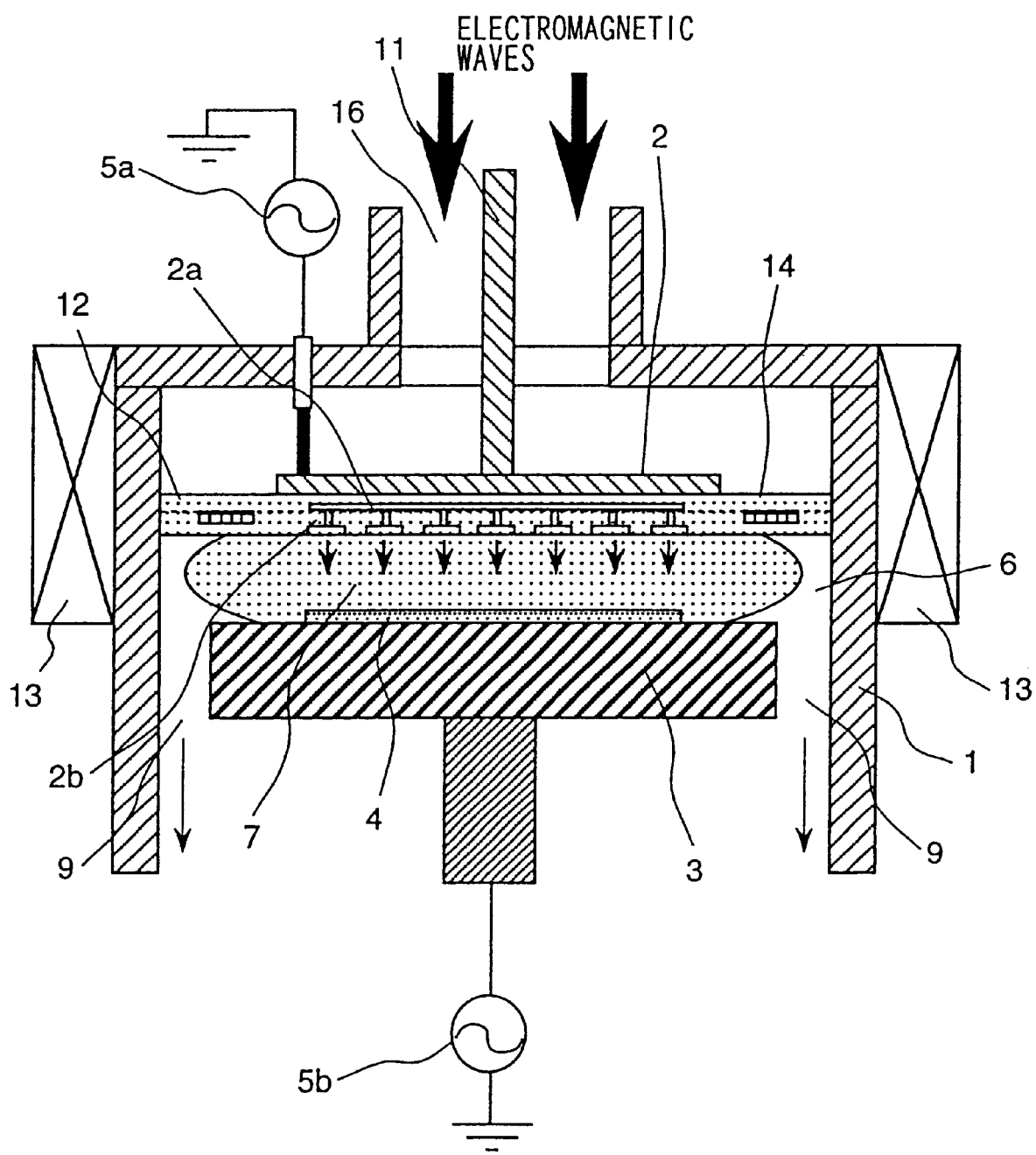
FIG. 14 is a cross-sectional view of another embodiment of the present invention.

FIG. 14 is a cross sectional view of another embodiment of the present invention, in which the quartz block 12 having a shower head construction is installed on the surface of the first plate 2 opposite to the second plate 3. At the outer periphery inside of the quartz block 12, the electromagnetic wave distribution corrector 14 is inserted. Such a device constitution is used in a device in which it is undesirable to expose the electrode directly as the surface opposite to the board. By use of such a constitution, the consumption of the electrode is suppressed and the life span of the device is lengthened.

Figure 15:
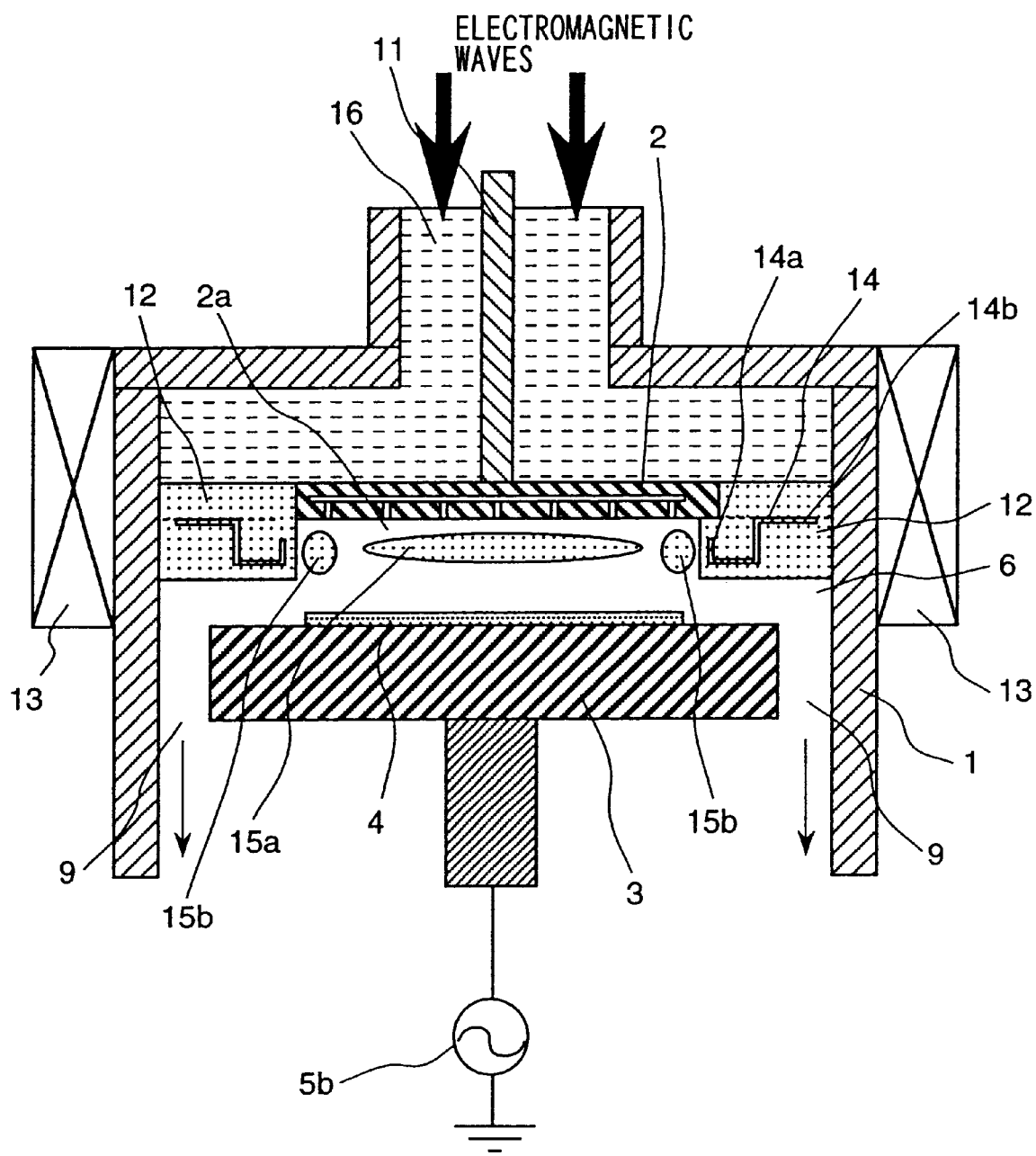
FIG. 15 is a cross-sectional view of another embodiment of the present invention.

FIG. 15 is a cross sectional view of another embodiment of the present invention. In this embodiment, the electromagnetic wave distribution corrector 14 is composed of cup-shaped member 14*a* which is disposed closer to the center of the device, and the handle-shaped member 14*b*, which is connected to it so as to have a ladle-shaped cross-section. By use of such a constitution, the auxiliary power deposition 15b generated on the side of the member 14a closer to the center of the device is generated in the neighborhood of the power deposition 15a formed at the center of the device. The plate 14b is composed of a conductor and operates to adjust the interval between the chamber 1 and the first plate 2 and to lead an intense electric field to the surface of the plate 14a. By use of such a constitution, a uniform and highly dense plasma can be formed in the radial direction within a small radius and there is an effect of energy conservation.

Figure 16A:
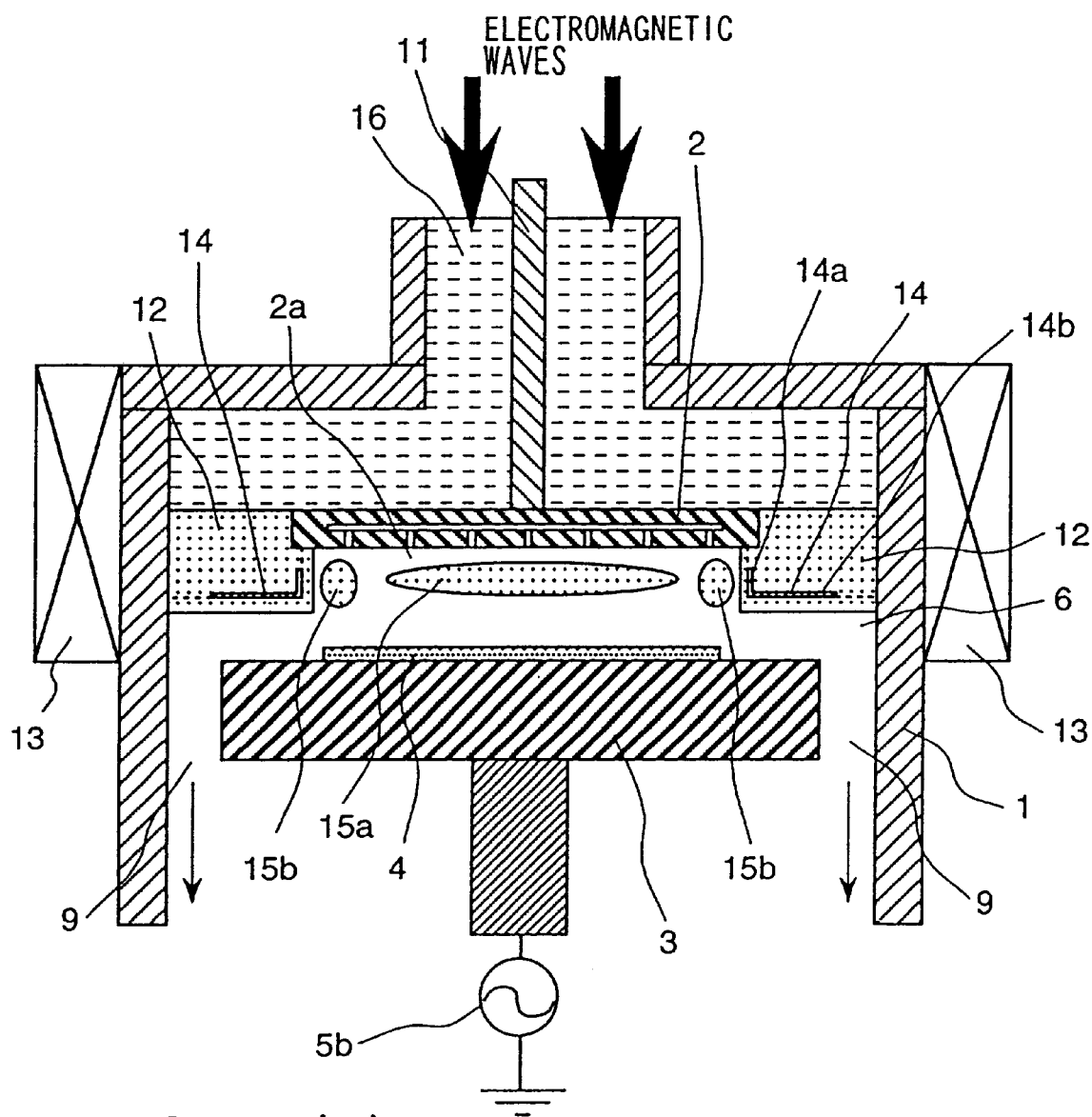
FIG. 16($a$) is a cross-sectional view of another embodiment of the present invention, and FIG. 16($b$) is a cross-sectional view of a portion of the apparatus of FIG. 16($a$) showing the shape of the electromagnetic wave distribution corrector.
Figure 16B:
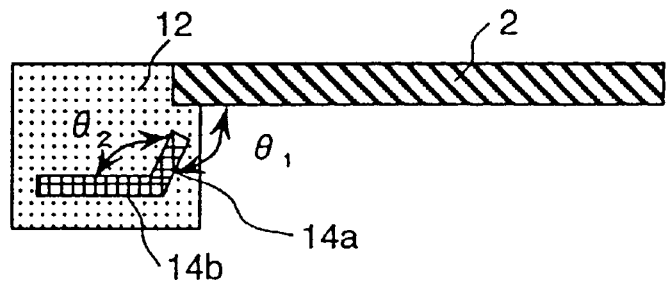

FIG. 16(a) is a cross sectional view of another embodiment of the present invention. FIG. 16(b) is a sectional view showing the detailed shape of the portion in which the electromagnetic wave distribution corrector 14 is disposed. The electromagnetic wave distribution corrector 14 is composed of the first correction plate 14a which is closer to the center of the device and the second correction plate 14b connected to it so as to have an almost L-shaped section. Namely, the electromagnetic wave distribution corrector is composed of the first correction plate 14a disposed at an angle of θ1 within 90 degrees ±45 degrees relative to the first plate, and the second correction plate intersecting the first correction plate at an angle of θ2 within 90 degrees ±45 degrees. When θ1 and θ2 are 90 degrees, the electromagnetic wave distribution corrector 14 and the quartz block 12 enclosing it can be prepared easily. When the auxiliary power deposition 15b is to be generated slantwise against the first plate 2 and wider in diameter, θ1 is set to 90 degrees or more.

When the electromagnetic wave distribution corrector 14 is structured in an almost L-shape like this, the auxiliary power deposition 15b generated on the side of the first correction plate 14a closer to the center of the device is generated in the neighborhood of the power deposition 15a formed at the center of the device. The second correction plate 14b is composed of a conductor and operates to adjust the interval between the chamber 1 and the first plate 2 and to lead an intense electric field to the surface of the first correction plate 14a. By use of such a constitution, a uniform and highly dense plasma can be formed in the radial direction within a small radius, and there is also an effect of energy conservation. At the same time, compared with the embodiment shown in FIG. 15, the structure is simple, and assembling with the quartz block 12 is easy, so that the manufacturing cost is reduced.

FIG. 17 is a table which shows the simulation results when the electromagnetic wave distribution corrector 14 is formed in (a) a ladle-shape (FIG. 15) and (b) an almost L-shape (FIG. 16). In the UHF electric distribution, both contours and electric field vectors are shown. When the performance is given priority, a combination of the first correction plate 14a and the second correction plate 14b having the shape of a ladle can be considered, though an extremely complicated structure is difficult to manufacture. The simulation shows that even in a conductor ring having a simple structure like an almost L-shape, sufficient performance can be obtained.

Figure 18:
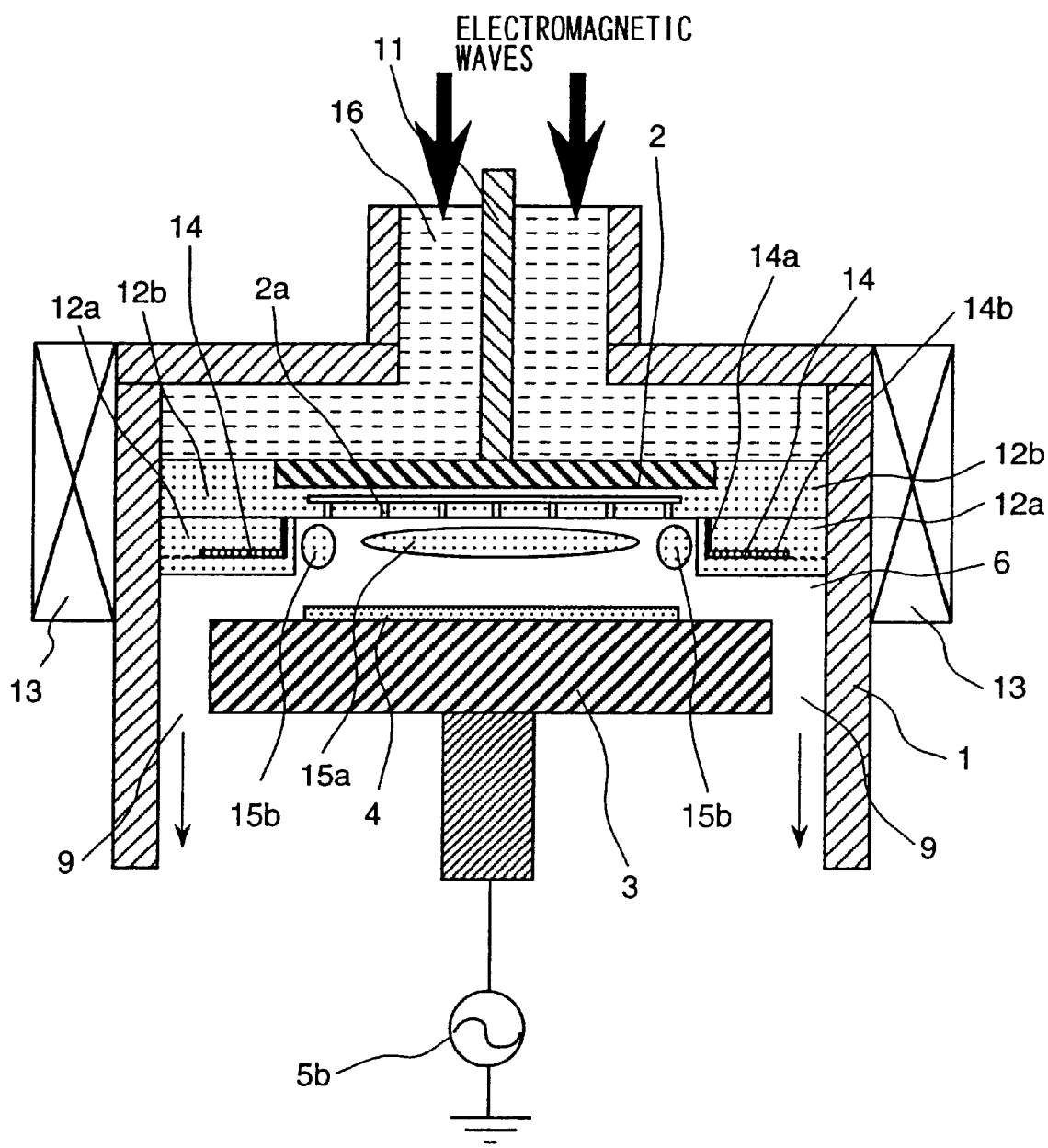
FIG. 18 is a cross-sectional view of another embodiment of the present invention.

FIG. 18 is a cross sectional view of another embodiment of the present invention. In this embodiment, the almost L-shape electromagnetic wave distribution corrector shown in FIG. 16 is applied to an electrode structure as shown in FIG. 14. The quartz block 12 having a shower head construction is installed on the surface of the first plate 2 opposite to the second plate 3. The quartz block 12 is composed of the quartz block 12a and the quartz block 12b which projects into plasma. The almost L-shape electromagnetic wave distribution corrector 14 is inserted into the quartz block 12b. The quartz block 12a and the quartz block 12b may be separated from each other or integrated. The use of the division method for the quartz block 12 is determined depending on the easiness of assembling the parts. Such a constitution is applied to a device in which it is undesirable to expose the electrode directly as the surface opposite to the board. By use of such a constitution, the consumption of the electrode is suppressed and the life span of the device is lengthened.

Figure 19:
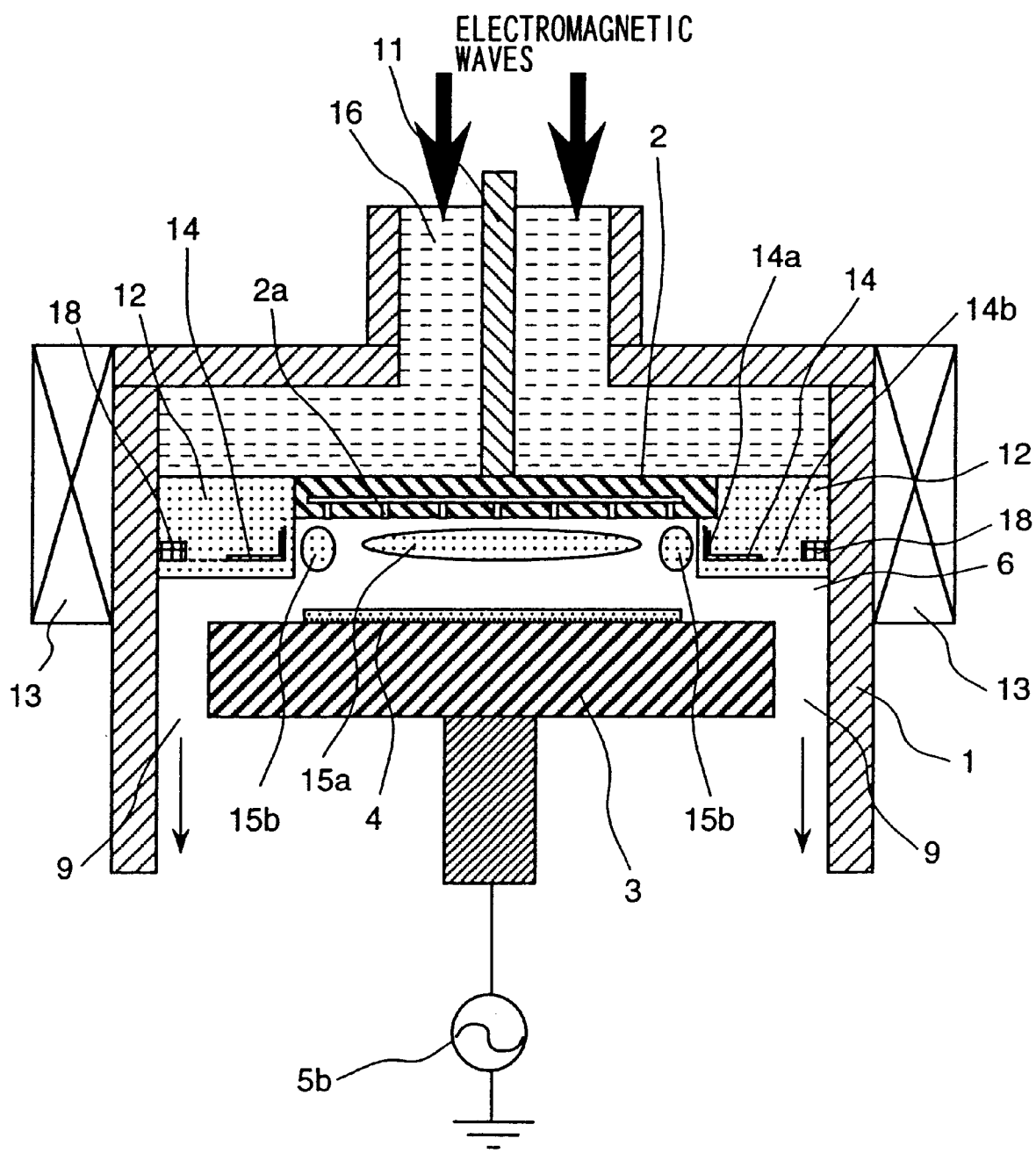
FIG. 19 is a cross-sectional view of another embodiment of the present invention.

FIG. 19 is a cross sectional view of another embodiment of the present invention. On the wall surface of the chamber 1, outside of the electromagnetic wave distribution corrector 14, the peripheral ring 18 is installed with a gap disposed between it and the electromagnetic wave distribution corrector 14. By use of such a constitution, the amount of electromagnetic waves leaking into the exhaust hole 9 along the wall surface of the chamber 1 outside the electromagnetic wave distribution corrector 14 is reduced and the strength of the power deposition 15 is increased.

Figure 20:
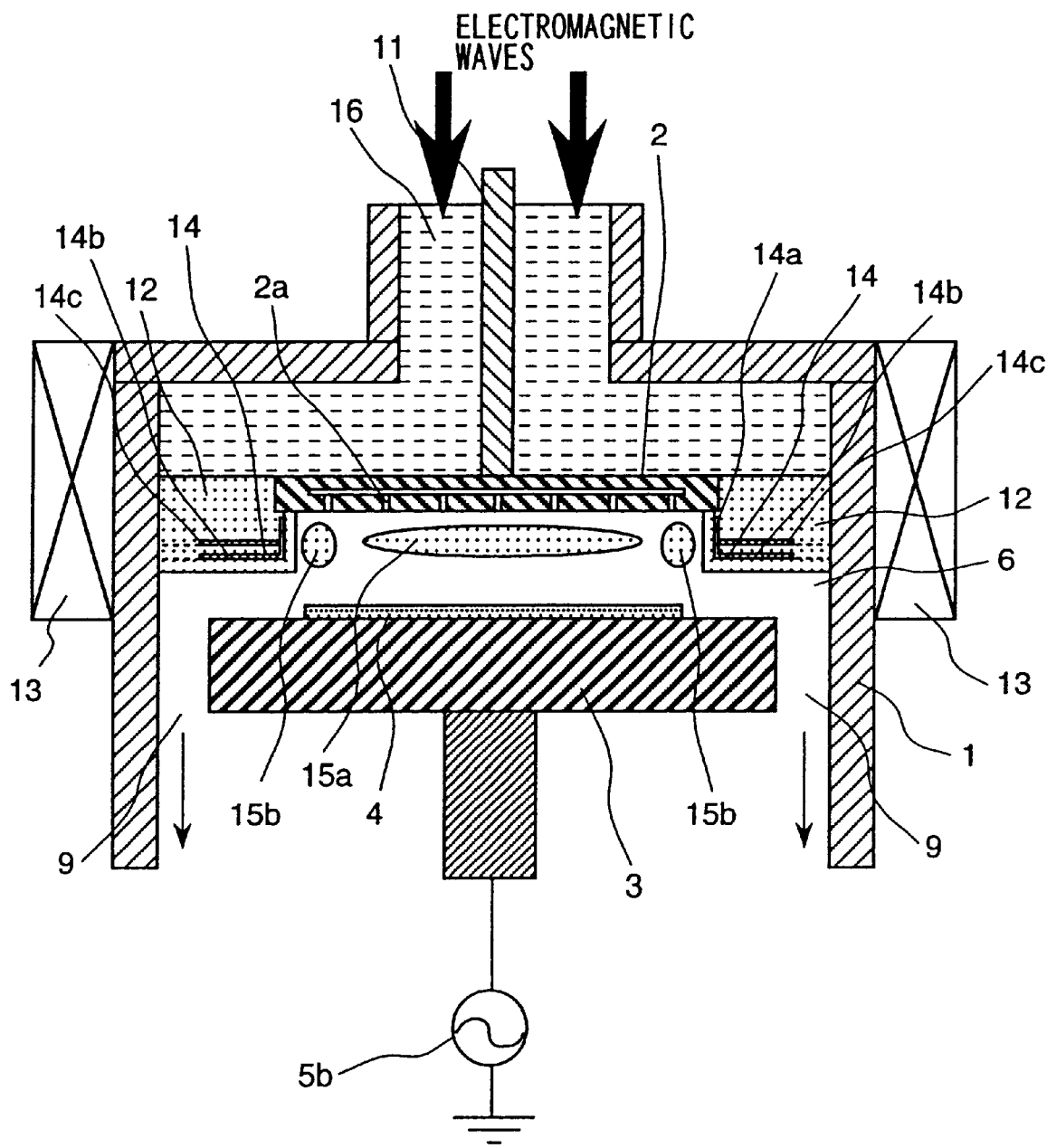
FIG. 20 is a cross-sectional view of another embodiment of the present invention.

FIG. 20 is a cross sectional view of another embodiment of the present invention. In this embodiment, the electromagnetic wave distribution corrector 14 is composed of the plate 14a closer to the center of the device and plural plates 14b and 14c connected to it. The plural plates 14b and 14c are arranged in the axial direction with a gap provided therebetween. When the electromagnetic wave distribution corrector 14 is structured like this, the strength of the auxiliary power deposition 15b generated on the side of the surface 14a opposite to the center of the device is increased, and a highly dense plasma can be formed, thereby providing an effect of energy conservation.

When a plasma processing device to which the present invention is applied is used to carry out a method of processing semiconductor boards and manufacturing LSIs, damage due to uneven plasma does not occur, so that extremely reliable products can be obtained.

The embodiments relating to a UHF electromagnetic wave ECR plasma device are described above. However, the embodiments can be commonly applied also to a surge excitation plasma device, such as a UHF plasma device having no magnetic field, and to a 2.45-GHz microwave plasma device. They can be also applied to a plasma CVD device. Furthermore, they can be applied also to a parallel flat plate capacity connection type plasma device and an inductive coupling type plasma device. When a power source having a frequency of 100 MHz or less is used, on the surface of the electromagnetic wave distribution corrector, which is electrically floated, opposite to the plasma, a charge is induced, an electric field is generated, and an auxiliary plasma is generated.

As described above, according to the present invention, when a board having a large diameter is to be plasma-processed, a plasma processing device and a plasma processing method capable of achieving uniform processing over the entire board surface can be provided.

What is claimed is:

1. A plasma processing device for supplying electromagnetic waves to a first plate, generating plasma in a vacuum atmosphere between said first plate and a second plate which is arranged opposite to said first plate, and processing a board loaded on said second plate, wherein a dielectric window member for propagating electromagnetic waves is installed in the outer periphery of said first plate and in said dielectric window member, an electromagnetic wave distribution corrector composed of an electrical conductor or a dielectric is embedded at a position spaced from said first plate and installed at a position above said second plate so that at least the side and bottom of said electromagnetic wave distribution corrector are not exposed in said vacuum atmosphere, said electromagnetic wave distribution corrector enabling the electromagnetic waves to propagate through said dielectric window member into said processing chamber.

2. A plasma processing device comprising a vacuum chamber for holding a vacuum atmosphere, a mechanism for introducing gas at a predetermined flow rate to said chamber and maintaining a predetermined pressure, a mechanism for introducing electromagnetic waves for converting said introduced gas to a plasma, a window for introducing said electromagnetic waves into said vacuum chamber, and a magnetic field generation device for generating a magnetic field in said vacuum chamber, wherein a dielectric window member for propagating electromagnetic waves is installed in the outer periphery of said first plate and in said dielectric window member, an electromagnetic wave distribution corrector composed of an electrical conductor or a dielectric is embedded at a position spaced from said first plate and installed at a position above said second plate so that at least the side and bottom of said electromagnetic wave distribution corrector are not exposed in said vacuum atmosphere, said electromagnetic wave distribution corrector enabling the electromagnetic waves to propagate through said dielectric window member into said processing chamber.

3. A plasma processing device according to claim 1 or 2, wherein said electromagnetic wave distribution corrector is in a ring-shape having almost the same center axis as that of a board disposed on said second plate to be processed.

4. A plasma processing device according to claim 1 or 2, wherein said electromagnetic wave distribution corrector is in a fragmented ring-shape such that said corrector is divided in the circumferential direction.

5. A plasma processing device according to claim 1 or 2, wherein the material of said electromagnetic wave distribution corrector is made of an electrical conductor selected from the group consisting of aluminum, copper, and iron.

6. A plasma processing device according to claim 1 or 2, wherein said electromagnetic wave distribution corrector is a liquid.

7. A plasma processing device according to claim 2, wherein said electromagnetic wave distribution corrector is electrically floated from the conductor surfaces of said chamber and said dielectric window member for propagating electromagnetic waves.

8. A plasma processing device according to claim 1 or 2, wherein said electromagnetic wave distribution corrector and said chamber are connected via a switch, whereby the potential of said electromagnetic wave distribution corrector can be controlled.

9. A plasma processing device according to claim 1 or 2, wherein said electromagnetic wave distribution corrector is mounted so that it can move up and down.

10. A plasma processing device according to claim 1 or 2, wherein gap change plates are arranged in a space between said chamber, said first plate, and the top of said window, whereby a gap formed in said space in the axial direction is changed in the radial direction, so that said gap above said electromagnetic wave distribution corrector in the axial direction is made narrower than the other gaps in said space.

11. A plasma processing device according to claim 1 or 2, wherein said electromagnetic wave distribution corrector comprises a first distribution correction plate disposed at an angle of 90 degrees ±45 degrees or less relative to said first plate and a second distribution correction plate intersecting said first distribution correction plate at an angle of 90 degrees ±45 degrees or less.

12. A plasma processing device according to claim 1 or 2, wherein said electromagnetic wave distribution corrector comprises a first distribution correction plate disposed angle of 90 degrees ±45 degrees or less relative to said first plate and a plurality of second distribution correction plates intersecting said first distribution correction plate at an angle of 90 degrees ±45 degrees or less.

13. A plasma processing device according to claim 1 or 2, wherein said electromagnetic wave distribution corrector comprises a first distribution correction plate disposed angle of 90 degrees ±45 degrees or less relative to said first plate and a plurality of second distribution correction plates intersecting said first distribution correction plate at an angle of 90 degrees ±45 degrees or less and on the wall surface of said chamber corresponding to the outer periphery side of said second distribution correction plate, a ring is installed.

14. A plasma processing device according to claim 11, wherein said first distribution correction plate is arranged in the direction almost perpendicular to said first plate.

15. A plasma processing device according to claim 11, wherein the intersection portion of said first distribution correction plate with said second distribution correction plate is the end on the far side from said first plate.

16. A plasma processing device according to claim 11, wherein the end on the opposite side of the intersection portion of said second distribution correction plate with said first distribution correction plate is extended in the neighborhood of the wall surface of said chamber on the back of said first plate.

17. A plasma processing method using said plasma processing device stated in claim 1, wherein electromagnetic waves of 100 to 900 MHz are supplied to said first plate, and to a sample to be processed loaded on said second plate, high frequency power of 100 kHz to 14 MHz is applied at 0.5 W/cm$^2$ to 8 W/cm$^2$ per unit area of said sample to be processed, and the surface treatment of said sample to be processed is performed.

18. A plasma processing method for supplying electromagnetic waves to a first plate, generating plasma in a vacuum atmosphere between said first plate and a second plate which is arranged opposite to said first plate, and processing a board loaded on said second plate, wherein said method includes a step of converting an atmosphere in which said board is loaded on said second plate to a vacuum atmosphere, a step of introducing gas into said vacuum atmosphere, a step of introducing electromagnetic waves of 100 to 900 MHz into said vacuum atmosphere via a dielectric window member which is disposed in the outer periphery of said first plate and in which an electromagnetic wave distribution corrector composed of an electrical conductor or a dielectric is installed at a position spaced from said first plate and installed at a position above said second plate so as to enable the electromagnetic waves to propagate through said dielectric window member into said vacuum chamber and generating a plasma, a step of etching said board loaded on said second plate using said plasma, and a step of taking said board out of said vacuum atmosphere.

19. A plasma processing method for processing a board using a plasma processing device having a vacuum chamber for holding a vacuum, a mechanism for introducing electromagnetic waves into said vacuum chamber including a first plate, a dielectric window member for introducing said electromagnetic waves into said vacuum chamber, a magnetic field generation mechanism for generating a magnetic field in said vacuum chamber, and a second plate which is arranged opposite to said first plate, wherein said method includes a step of evacuating said vacuum chamber in which said board is loaded on said second plate, a step of introducing gas into said vacuum chamber, a step of introducing electromagnetic waves of 100 to 900 MHz into said vacuum atmosphere via said dielectric window member which is installed in the outer periphery of said first plate and in which an electromagnetic wave distribution corrector composed of an electrical conductor or a dielectric is installed at a location spaced from said first plate and installed at a position above said second plate so as to enable electromagnetic waves to propagate through said dielectric window member into said vacuum chamber and generating a plasma, a step of etching said board loaded on said second plate using said plasma, and a step of taking out said board from said vacuum chamber.

20. A plasma processing method according to any of claims 18 and 19 wherein said board has a diameter of 200 mm to 350 mm.

21. A plasma processing device according to claim 12, wherein said first distribution correction plate is arranged in the direction almost perpendicular to said first plate.

22. A plasma processing device according to claim 12, wherein the intersection portion of said first distribution correction plate with said second distribution correction plate is the end on the far side from said first plate.

23. A plasma processing device according to claim 12, wherein the end on the opposite side of the intersection portion of said second distribution correction plate with said first distribution correction plate is extended in the neighborhood of the wall surface of said chamber on the back of said first plate.

24. A plasma processing device according to claim 13, wherein said first distribution correction plate is arranged in the direction almost perpendicular to said first plate.

25. A plasma processing device according to claim 13, wherein the intersection portion of said first distribution correction plate with said second distribution correction plate is the end on the far side from said first plate.

26. A plasma processing device according to claim 13, wherein the end on the opposite side of the intersection portion of said second distribution correction plate with said first distribution correction plate is extended in the neighborhood of the wall surface of said chamber on the back of said first plate.

27. A plasma processing device according to claim 1 or claim 2, wherein a space is provided for propagating the electromagnetic waves above said electromagnetic wave distribution corrector.

* * * * *